United States Patent
Gruening-von Schwerin et al.

(10) Patent No.: US 8,125,006 B2
(45) Date of Patent: Feb. 28, 2012

(54) ARRAY OF LOW RESISTIVE VERTICAL DIODES AND METHOD OF PRODUCTION

(75) Inventors: Ulrike Gruening-von Schwerin, Munich (DE); Peter Baars, Dresden (DE); Klaus Muemmler, Dresden (DE); Stefan Tegen, Dresden (DE); Thomas Happ, Dresden (DE)

(73) Assignee: Qimonda AG, Munich (DE)

( * ) Notice: Subject to any disclaimer, the term of this patent is extended or adjusted under 35 U.S.C. 154(b) by 694 days.

(21) Appl. No.: 12/188,401

(22) Filed: Aug. 8, 2008

(65) Prior Publication Data
US 2010/0032635 A1    Feb. 11, 2010

(51) Int. Cl.
*H01L 29/768* (2006.01)
(52) U.S. Cl. . 257/246; 257/248; 257/910; 257/E21.361; 257/E27.033

(58) Field of Classification Search .......... 257/246, 257/248, 910, E21.361, E27.033
See application file for complete search history.

(56) References Cited

U.S. PATENT DOCUMENTS
2006/0151771 A1* 7/2006 Asano et al. .............. 257/2
* cited by examiner

*Primary Examiner* — Bradley K Smith
*Assistant Examiner* — Amar Movva
(74) *Attorney, Agent, or Firm* — Dicke, Billig & Czaja, PLLC

(57) ABSTRACT

An integrated circuit comprising an array of memory cells and a corresponding production method are described. Each memory cell comprises a resistively switching memory element and a vertical selection diode coupled to a selection line in a selection line trench for selecting one cell from the plurality of memory cells. A selection line is coupled to the vertical selection diode at one vertical sidewall of the selection line trench.

14 Claims, 24 Drawing Sheets

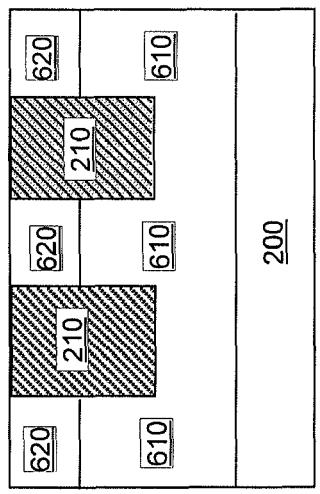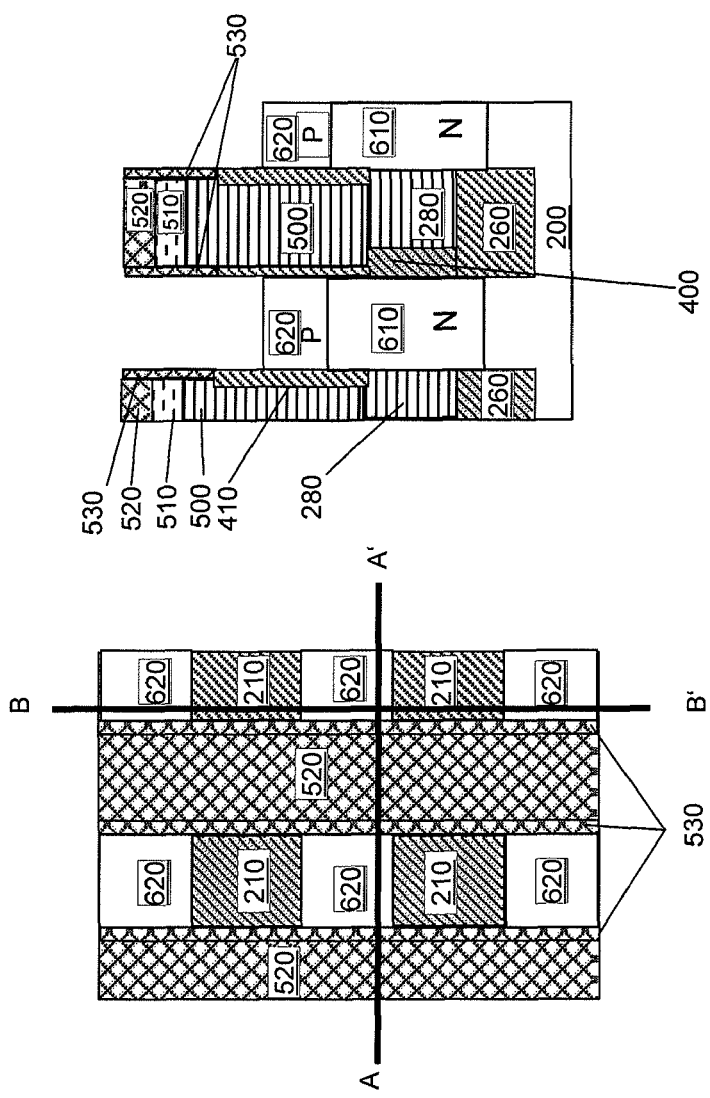
Fig. 6c
Fig. 6b
Fig. 6a

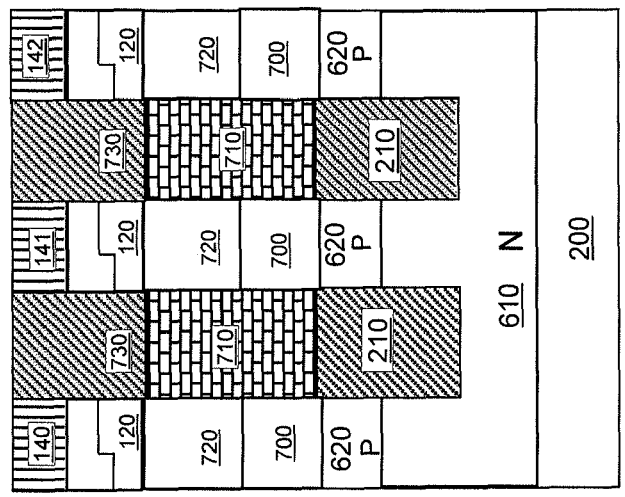
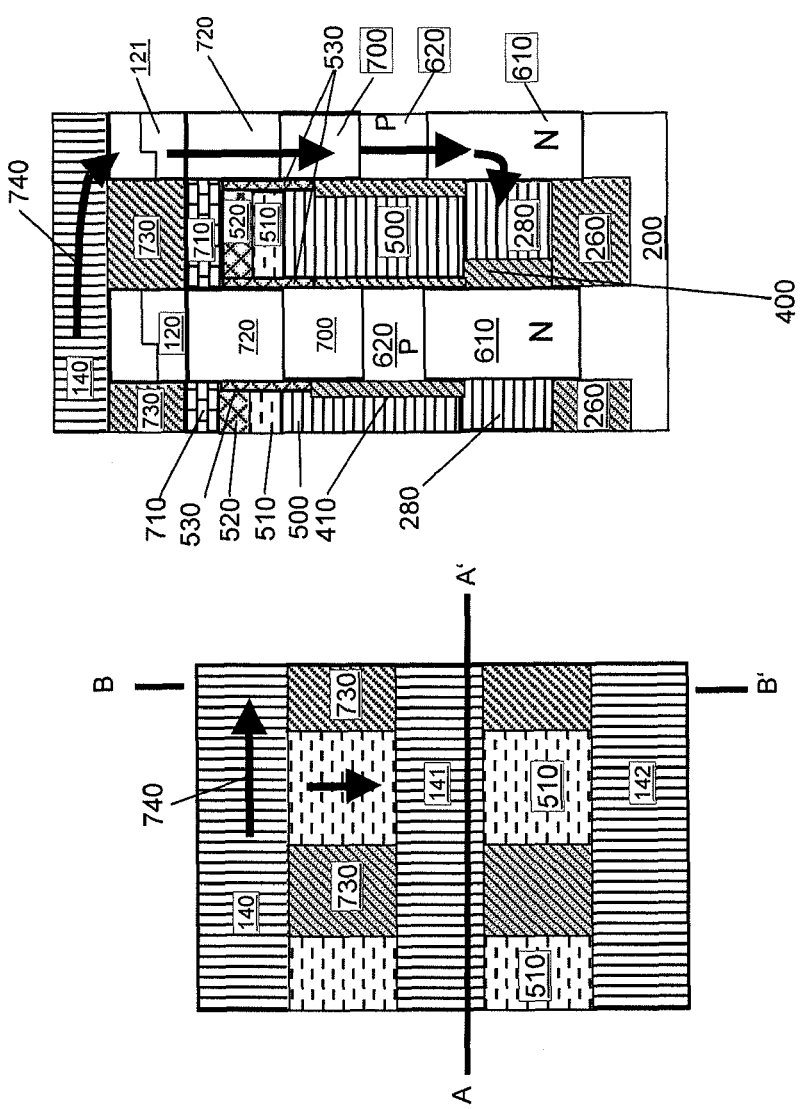
Fig. 7c
Fig. 7b
Fig. 7a

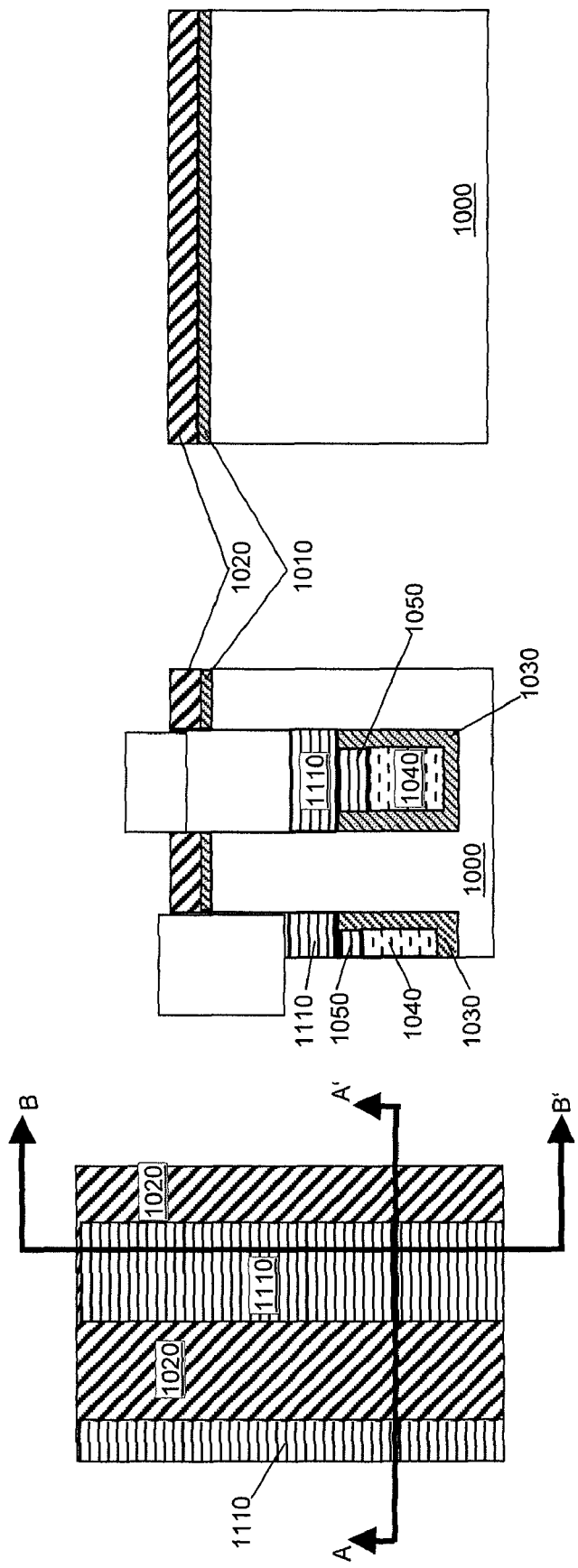

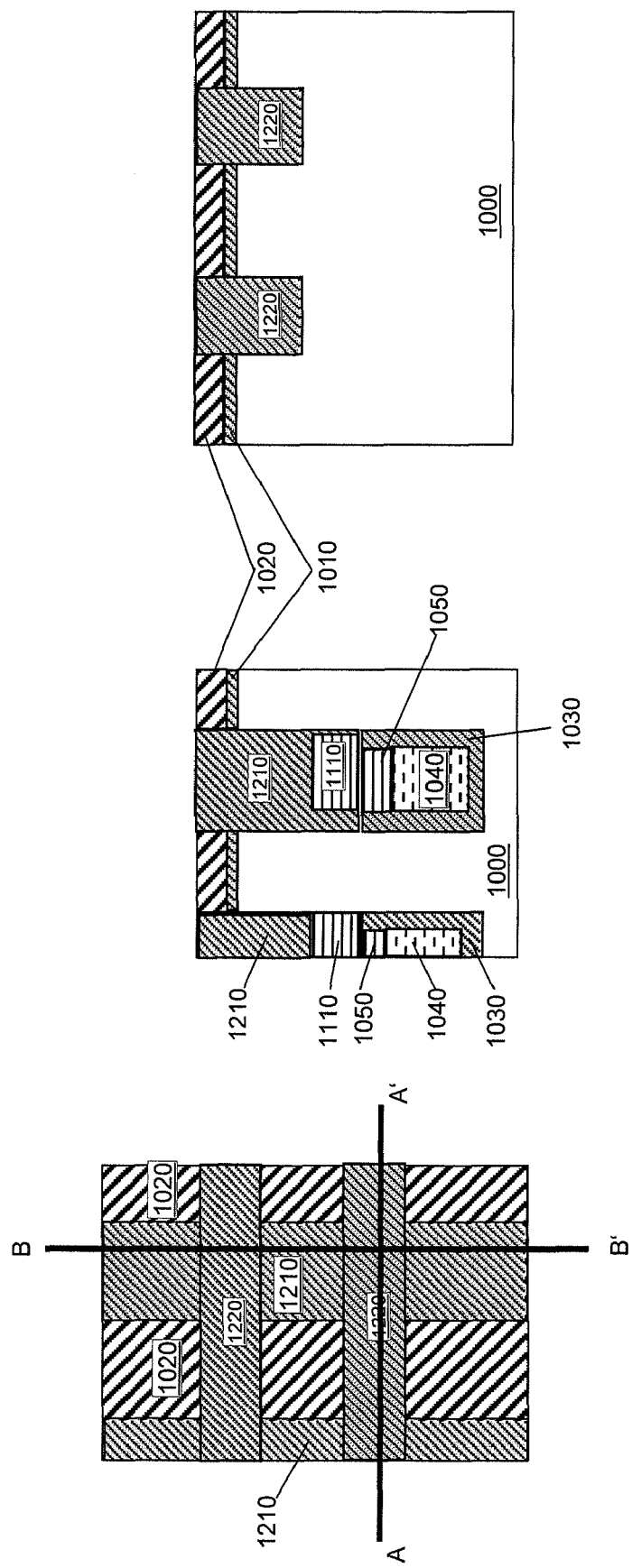

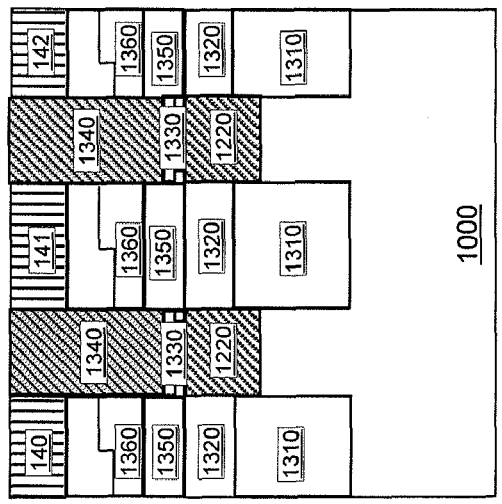
Fig. 13c
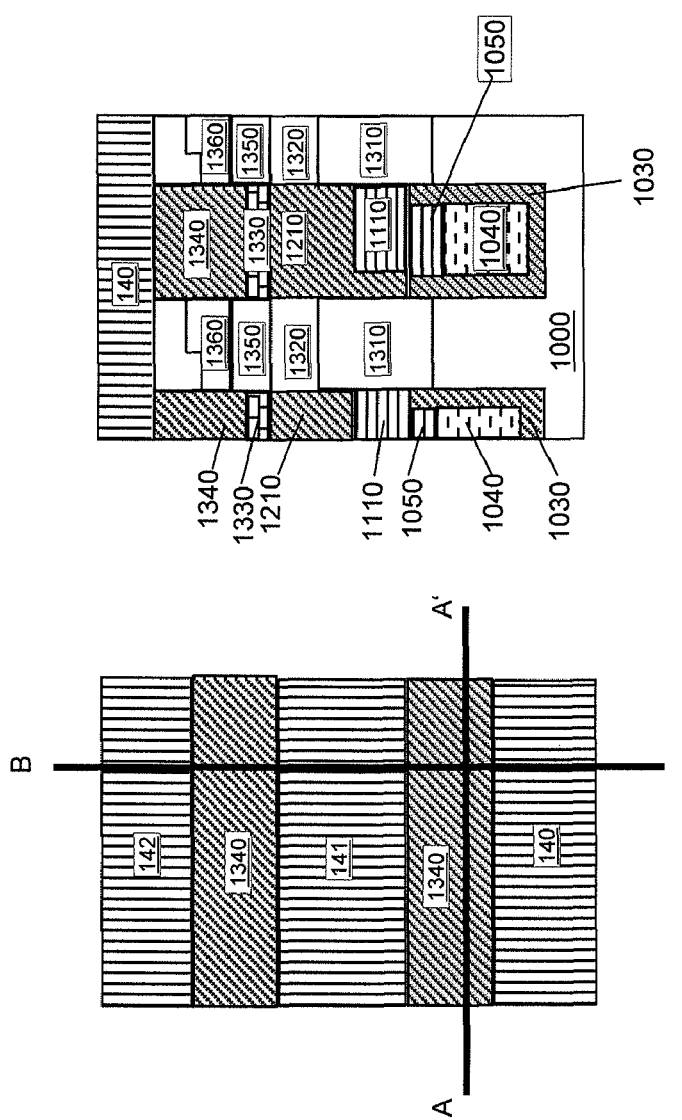
Fig. 13b
Fig. 13a

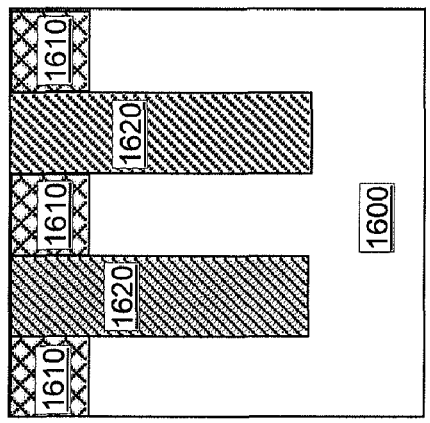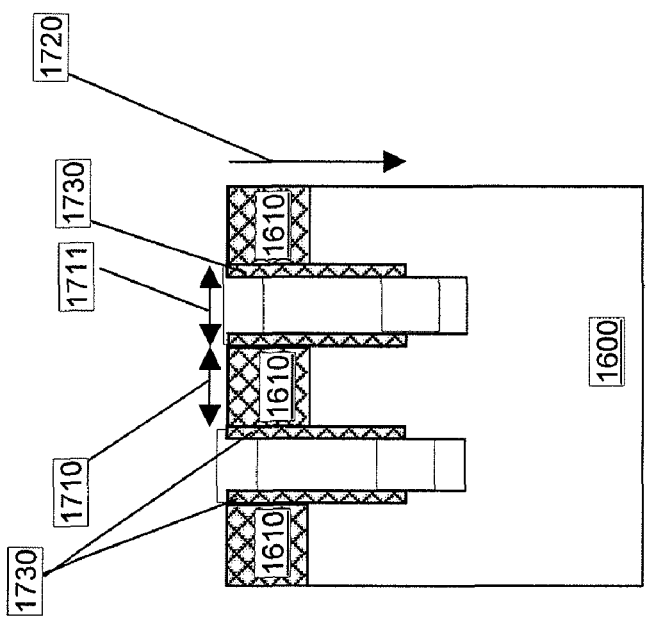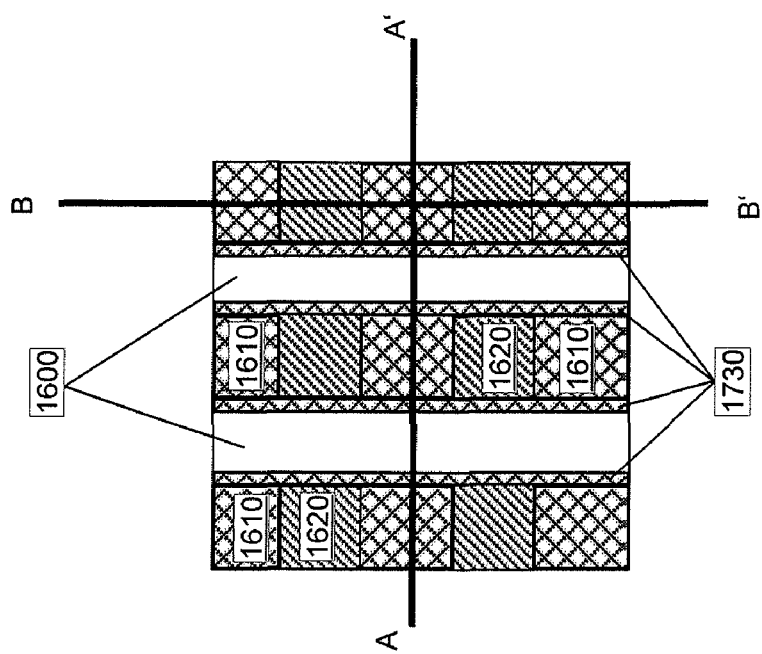
Fig. 17c
Fig. 17b
Fig. 17a

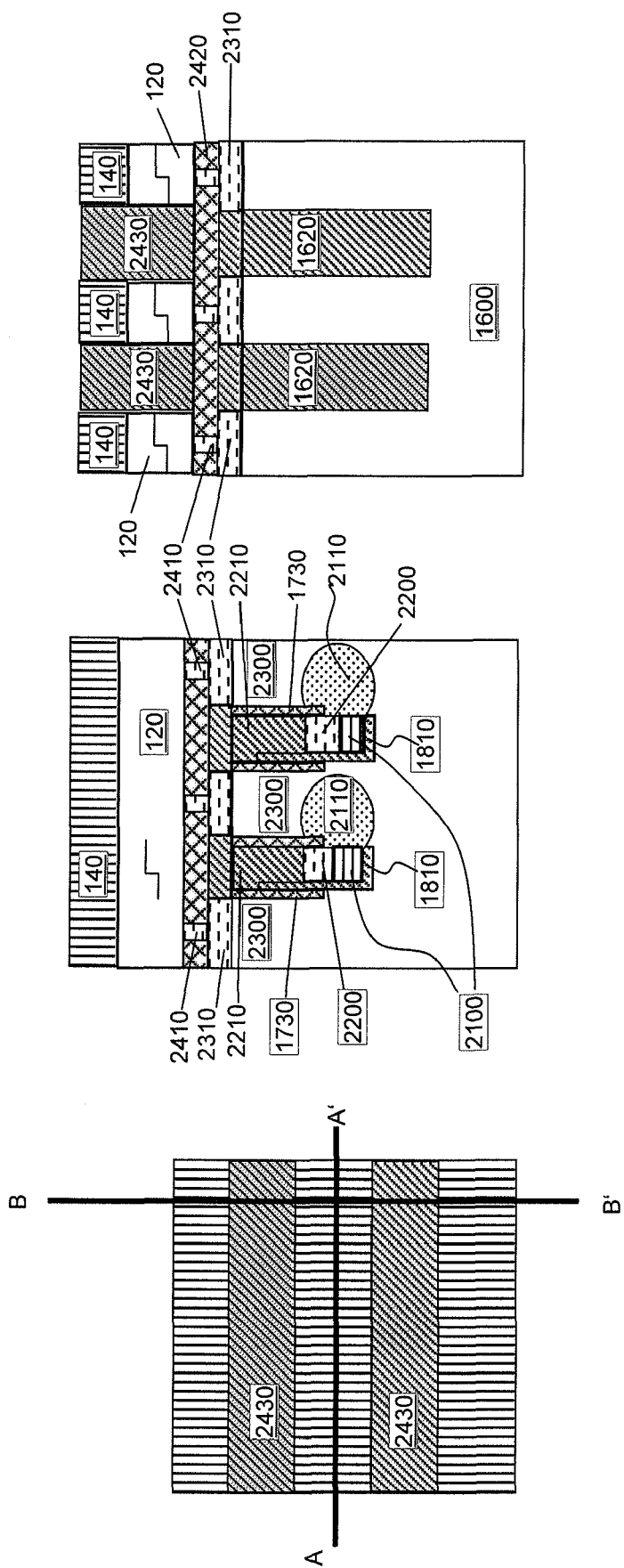

ARRAY OF LOW RESISTIVE VERTICAL DIODES AND METHOD OF PRODUCTION

BACKGROUND

This disclosure relates to an array of vertical diodes to select one of a plurality of resistively switching memory cells and a method for forming the array of diodes.

In resistively switching memory cells, for example phase change random access memory (PCRAM) or magneto resistive random access memory (MRAM), the information is stored in a volume of switching active material, wherein the switching active material may switch between two states. In a first state the switching active material may have a high resistivity, i.e., a low conductivity, and a lesser resistivity, i.e., a higher conductivity, in a second state. Accordingly the information of a bit may be assigned to a PCRAM cell, wherein the state of the cell reflects the status of the bit. Although the disclosure is described for PCRAM cells in the following, the structure and methods can be used for any random access memory including diodes as selection means.

For reading a resistively switching memory cell the resistance of the volume of resistively switching material is sensed, i.e., the conductivity is sensed. This can be achieved for example by applying a predefined voltage to the cell and sensing the amplitude of the current flowing through the cell. For switching the state of a resistively switching memory cell a high current is sent through the volume of switching active material in order to heat and subsequently change the material from a one state to the other. Accordingly a selection diode included in the cell thus should be able to send a strong current through the cell.

To be cost competitive, a small cell size and a cost competitive process is required for a memory product including resistively switching memory cells. In conventional architectures a 1D1R assignment is used, i.e., one diode (D) for selecting one resistively switching memory element (R) from a plurality of memory elements.

For these and other reasons, there is a need for the present invention.

BRIEF DESCRIPTION OF THE FIGURES

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2a-c to 7a-c illustrate a schematic top-down and cross sectional views of an embodiment in subsequent processing stages.

FIGS. 10a-c to 13a-c illustrate schematics of another embodiment.

FIGS. 25a-c illustrate schematics of another embodiment.

DETAILED DESCRIPTION OF THE FIGURES

Figure 1:
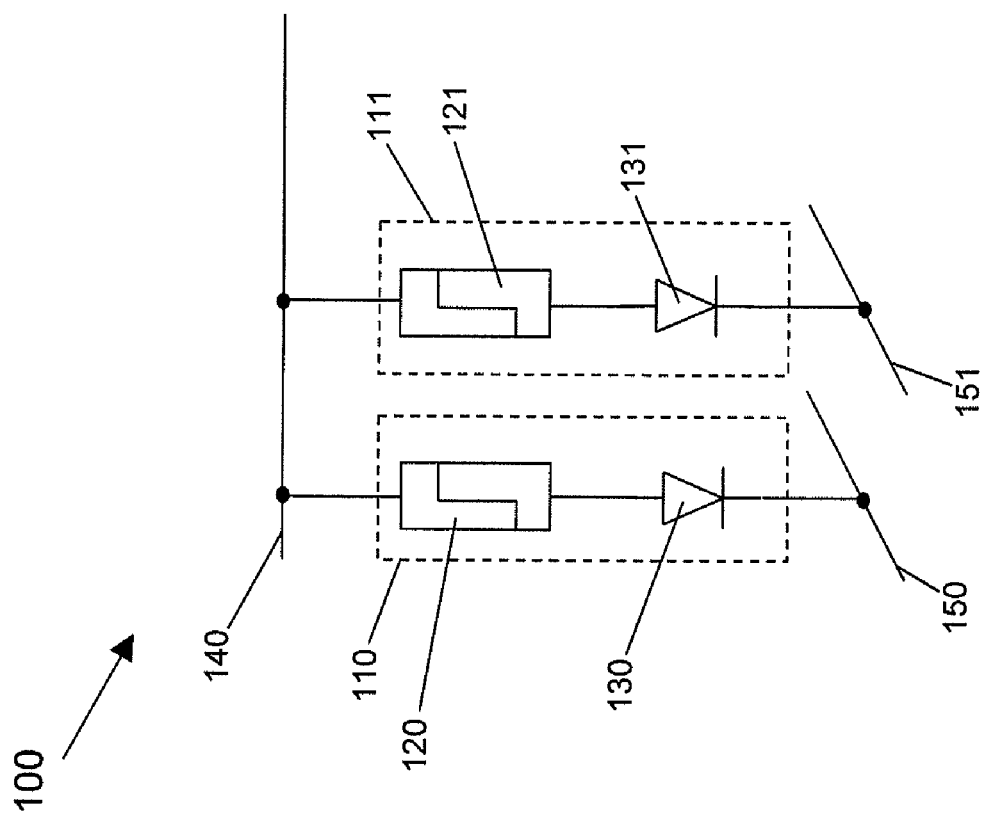
FIG. 1 illustrates a schematic circuit diagram of two memory cells representing an array of several memory cells.

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The electrical circuit 100 illustrated in FIG. 1 includes a first and a second memory cell 110, 111 exemplifying a plurality of identical memory cells arranged in an array of memory cells, for example in an integrated circuit including a resistively switching memory element. Examples of the resistively switching memory elements for example include a volume of phase change material or a volume of magneto resistive material, such that the memory cells are PCRAM or MRAM respectively. Each cell includes a volume of switching active material 120, 121, i.e., a resistively switching memory element, and a diode 130, 131 for selecting one memory element from the plurality of memory elements. The memory elements are coupled to a first selection line, for example a bit line 140, and to an associated diode, which in turn is coupled to a second selection line, for example a word line 150, 151. In the direction of the first selection line a plurality of memory cells is coupled to one first selection line, wherein each memory cell is coupled to a different second selection line. Vice versa in the direction of a second selection line a plurality of memory cells is coupled to one second selection line, and wherein each cell is coupled with its residual contact to a different first selection line.

An individual memory cell 110 is thus coupled to an individual pair of one first selection line 140 and one second selection line 150 and may be selected by selecting the pair of the lines. For operating a cell the voltage of the associated first selection line is raised until the diode reaches the conducting state, such that a current flows from the first selection line through the memory element and the diode to the second selection line, which dissipates the current. It is apparent that the direction of the diode and thus the direction of the current flow may easily be inversed by exchanging the P+ and the N doped regions of the diode and the direction of the applied voltage respectively.

The subsequently described drawings illustrate processing stages of the embodiments when producing the array of memory cells, and in particular the array of selection diodes.

Figure 2C:
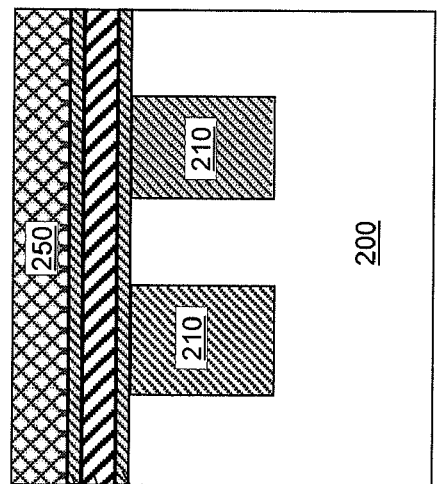
Figure 2B:
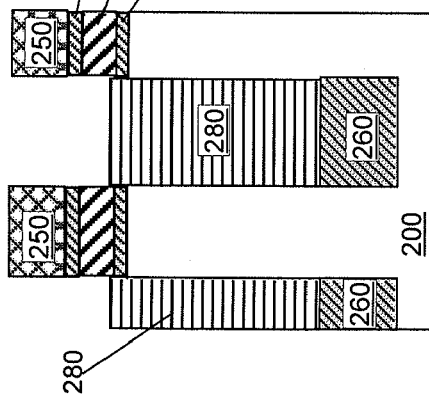
Figure 2A:
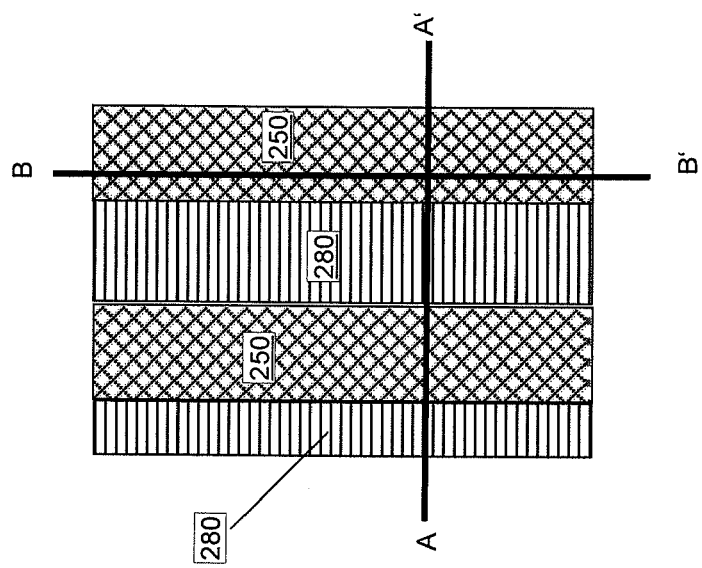

FIG. 2a illustrates a top-view on and FIGS. 2b, 2c illustrate cross sectional views through a chip along cut lines A-A' and B-B' respectively after having performed first processing steps. In this and the subsequent figures illustrating the embodiments the cut lines are maintained stationary, i.e., line A-A' runs parallel to and through a first selection line 140 and line B-B' runs parallel to but external to second selection lines 150.

With regard to the terminology used hereinafter the initial surface of the chip, i.e., before a first processing step is performed, forms a reference plane to which geometrical terms refer. For example the term vertical accordingly denotes a direction parallel to the surface normal of the reference plane.

Starting from a substrate 200 trenches are etched and filled with an insulating material to form a shallow trench insulation (STI) 210. Substrate 200 in this embodiment may be slightly p-doped. The insulating material filling the trenches may be any suitable insulator, for example such as a silicon oxide, i.e., in particular silicon dioxide. As cut line B-B' runs parallel to a second selection line, which will be produced in a later processing step, the STI is illustrated in FIG. 2c.

The formation of the STI preferentially can be combined with forming insulation in the peripheral of the array, such that processing steps can be used to form the STI 210 and at the same time to form any peripheral insulation.

Subsequently to forming the STI an insulating layer 220, for example of silicon dioxide, and a layer of poly silicon 230 are formed on the chip surface. These layers may later optionally serve as part of the gate stack for the peripheral devices.

Then a hardmask including for example a first layer 240, e.g., of silicon dioxide, and a second layer 250, for example of silicon nitride, are deposited on the surface of the chip, wherein the second layer 250 may be comparatively thick to subsequently also serve as a thick nitride pad.

The hardmask is then structured by conventional lithographic processes in order to enable the etching of second selection line trenches arranged perpendicular to the STI, wherein the STI 210 is also etched in order to produce non-stop, i.e., continuous, trenches, and wherein the second selection line trenches extend deeper into substrate 200 than the STI. In variations the trenches can be formed tapered or the sidewalls may have steps such that the bottom surface is smaller than the opening, which enables an easy and reliably filling of the trenches.

The trenches are then oxidized, for example by a conventional oxidation method such as thermal oxidation, to produce a thin layer of insulating silicon dioxide at the bottom and the sidewalls of a second selection line trench. Optionally a comparatively thin insulating liner of silicon nitride—not illustrated in the drawings—may be deposited on the bottom and the sidewalls of the trenches.

Then the trenches are filled with a suitable insulating material 260, for example such as silicon oxide, which is subsequently recessed by an etching process, such that a thick layer of insulating material 260 is arranged at the bottom of the trenches. Then the trenches at this stage are excavated to a depth, such that—in view of the diode to be produced in the adjacent substrate—the buried diode contact can be formed at a suitable depth for contacting the diode. As illustrated in subsequent drawings the trench may be excavated below the depth of the shallow trench insulation 210.

In case the optional liner, for example of silicon nitride, was applied to the sidewalls of the second selection line trench, this is removed for example by a chemical wet etching process being selective to the substrate material and the insulating material filled into the trenches, followed by removal of any insulating sidewall oxide. In this way the sidewalls of the second selection line trenches bare the substrate material, i.e., silicon. Once the silicon of the substrate is bared, i.e., the liners are removed.

Subsequently the second selection line trenches are filled with a suitable conducting material 280, for example such as conducting poly silicon. Prior to deposition of the conducting material 280, a thin conductive interface layer may be applied (like a thin conductive nitride interface). The conducting material subsequently is recessed to a level essentially equaling the surface level of insulating layer 220, i.e., below the top level of thick pad nitride 250.

FIG. 2a in a top view on the chip illustrates the stripes of thick pad nitride 250 alternating conducting material 280 in the second selection line trenches.

Figures 3A, 3B, 3C:
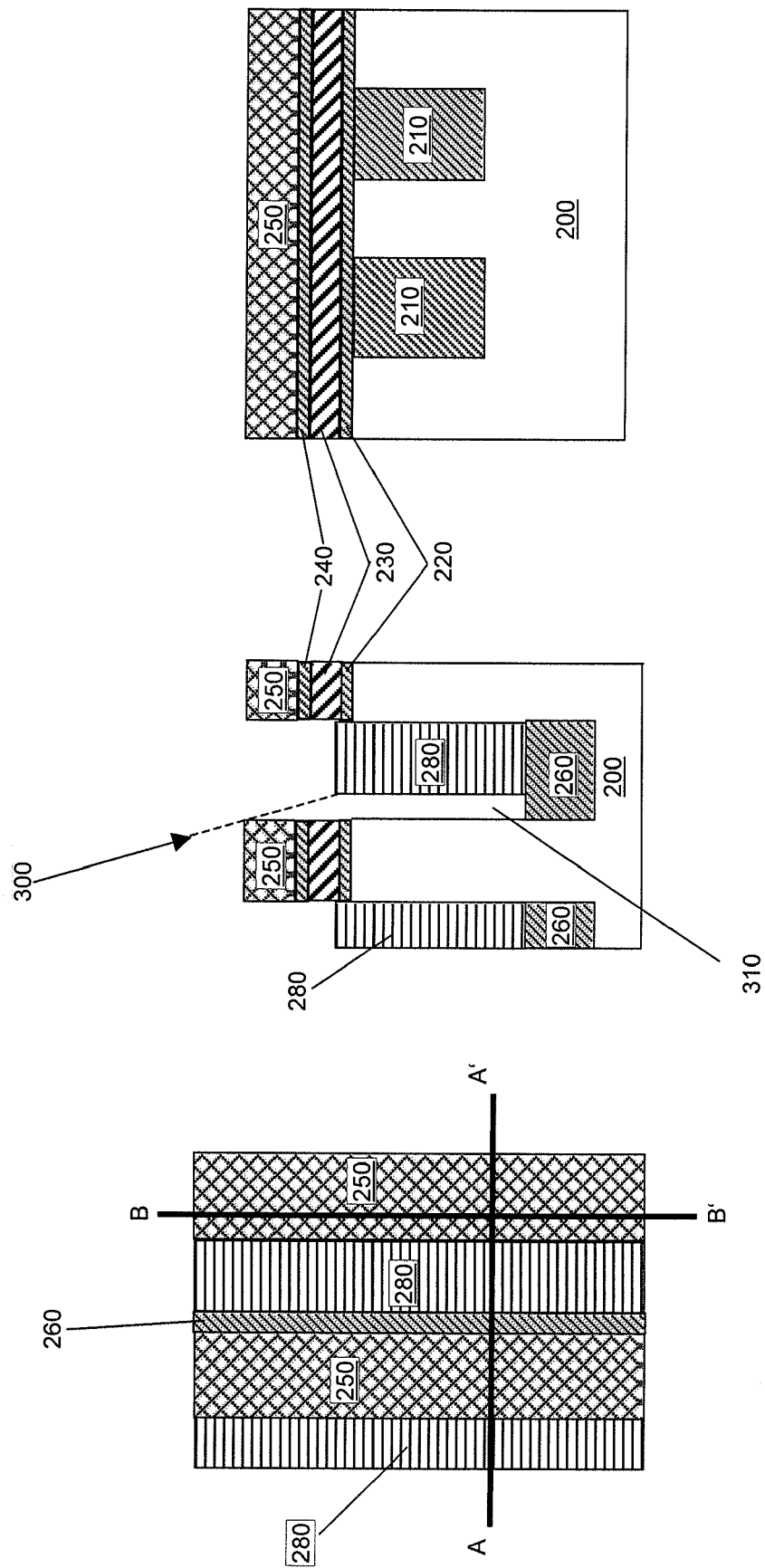

FIGS. 3a to 3c illustrate the top view on the chip and the cross sectional views after removing the conducting material 280 from one sidewall of a second selection line trench.

A suitable mask for removing conducting material 280 from one sidewall of the second selection line trench, i.e., for etching a crevice 310 into material 280, can be formed by depositing a liner of silicon nitride and a liner of undoped poly silicon on the chip, wherein the liners are thin to follow the ridges and the cavities of the surface. The liners are not illustrated in the drawing.

Subsequently an angled boron implant is performed to implant boron ions into the poly silicon liner, wherein the implant angle may be as indicated by arrow 300. Accordingly one of the sidewalls and a portion of the second selection line material 280 in the second selection line trench remains undoped, as the boron ions are shadowed by the ridge of the thick pad oxide 250 from these areas. In the FIG. 3b the left sidewall and a portion of second selection line material 280 starting from the left sidewall remain undoped.

The undoped poly silicon liner is then removed selectively to the boron doped poly silicon thus structuring lines baring the liner below of silicon nitride between remaining lines of doped poly silicon, wherein the lines of the bared silicon nitride liner are comparatively small and situated above the poly silicon filled second selection line trenches. The remaining lines of boron doped poly silicon liner are then oxidized to produce an oxide hardmask. In a subsequent etching process the bared liner of silicon nitride, the poly silicon 280 in the second selection line trenches are anisotropically etched, such that a narrow crevice 310 is formed, wherein the crevice 310 extends at least to the insulating trench oxide 260, such that the conducting second selection line material 280 and the coating 270 do not contact the substrate material 200 at one side of the second selection line trench, which is in the illustrated drawing the left side of the second selection line trench.

Figure 4C:
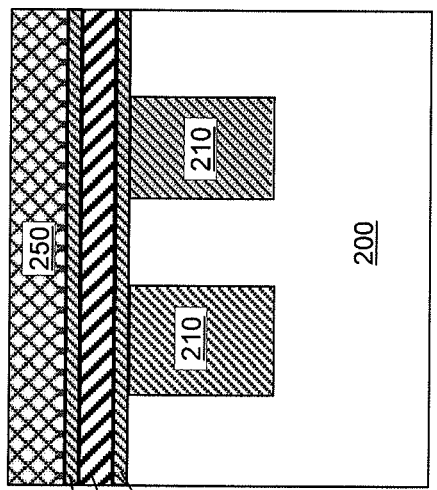
Figure 4B:
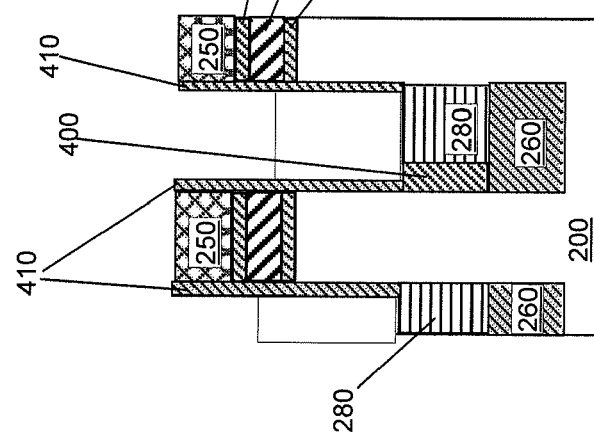
Figure 4A:
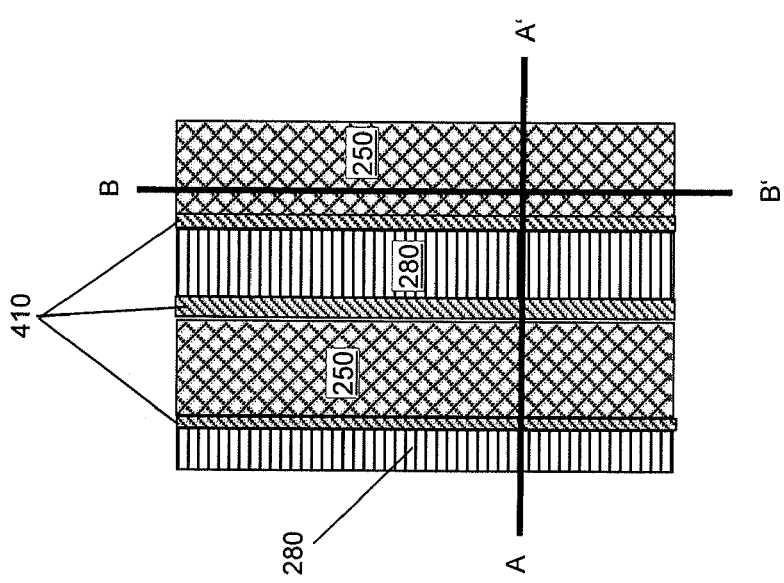

FIGS. 4a to 4c illustrate the top view on the chip and the cross sectional views after the crevice 310 has been filled with a suitable dielectric 400, for example silicon dioxide, which subsequently is removed from the surface of second selection line material 280 by an etching process. At one side of the second selection line trench second selection line material 280 thus is permanently insulated from the substrate material 200. The conducting second selection line material 280 is then recessed by an etching process selective to dielectric 400, such that in the lower portion of a second selection line trench the conducting material 280 at one side is electrically coupled to the substrate 200 via the conductive coating 270, while at the opposite side of the second selection line trench dielectric 400 insulates material 280 from substrate 200. Optionally dielectric 400 may be also removed, as illustrated in the illustrated embodiment, or thinned at the exposed sidewalls by an isotropic wet etching process, wherein the insulating material maintains in the crevice.

Subsequently a coating of insulating material 410 is applied to the vertical sidewalls of a second selection line trench, wherein the insulating material 410 may be any suitable dielectric such as for example silicon dioxide. The coating may be shaped by depositing material 410 and a subsequent anisotropic spacer etch, which removes the material from horizontal surfaces and thus bares the top surface of conducting material 280, but leaves the material at vertical surfaces, such that both sidewalls of a second selection line trench are covered by the insulating material 410.

Figures 5A, 5B, 5C:
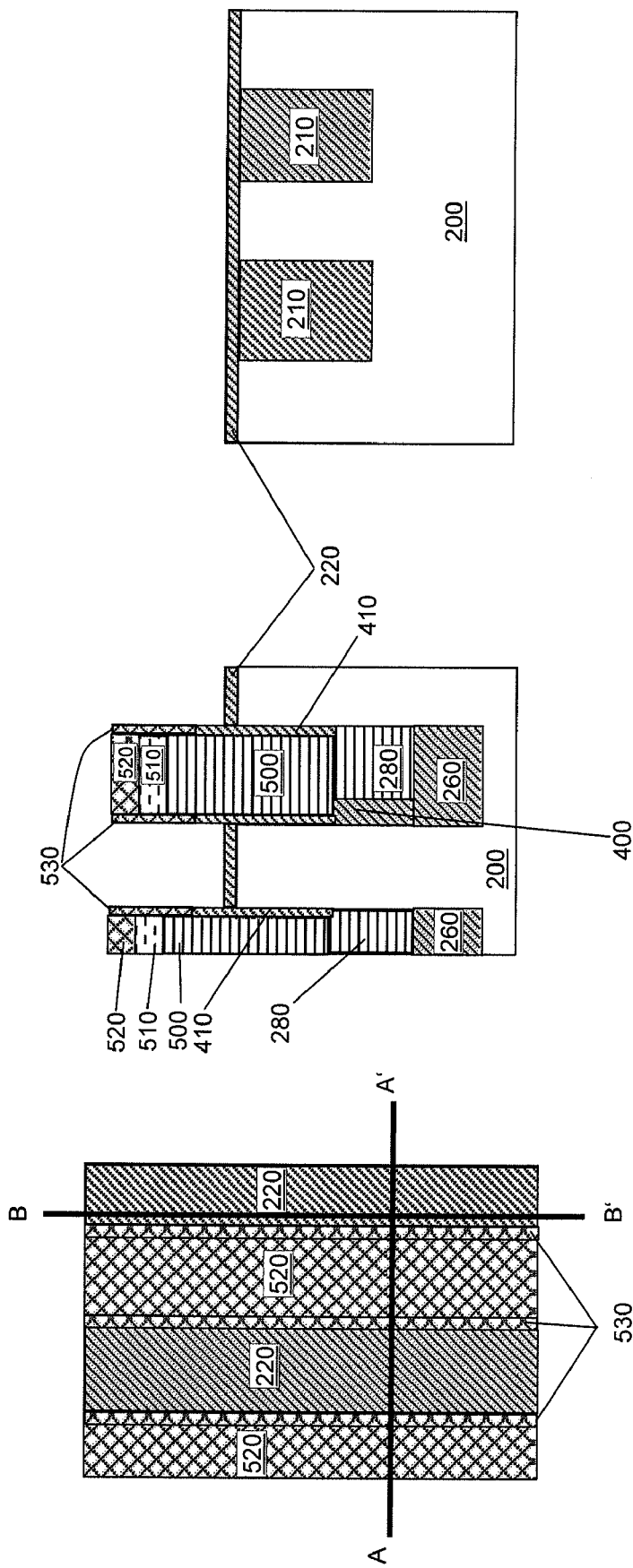

Then, as illustrated in FIGS. 5a to 5c, the thick pad nitride 250 and the insulating layer 240 are removed by a suitable process, for example a wet chemical etch, from the top surface of the chip.

Subsequently the second selection line trenches are filled with a suitable conducting second selection line material 500, for example such as poly silicon. Then a metal-containing layer stack 510, for example tungsten, following a suitable interfacial material like tungsten nitride (WN) or titanium nitride (TiN), and a layer of suitable insulating material such as silicon nitride 520 may be deposited on the chip. Second selection line material 500 and material 230, metal layer 510 and insulating layer 520 are then structured to form second selection lines, wherein the second selection lines are structured as a second selection line stack including at least a first layer of conducting material 500 coupled to a second, metal-containing layer 510. The metal layer in turn may be covered by a layer of insulating material 520, which in this embodiment will form a nitride cap on the second selection line. The structuring of the second selection line stack may be performed by a conventional etching process using a hardmask with conventional lithographic and etching process processes.

After the second selection lines have been shaped, i.e., layers 500 to 520 are shaped to stripes, insulating spacers 530 are formed to insulate the sidewalls of the second selection line stacks. This can be achieved for example by depositing an insulating layer, for example of silicon nitride, on the chip and a subsequent anisotropic etching process, which substantially removes the material from horizontal surfaces only, such that the vertical sidewalls of the second selection lines remain covered by the insulating material 530.

Accordingly the second selection line includes a third conducting layer 510 arranged on top of a second conducting layer 500, which in turn is located on top of a first conducting layer 280 coupling to one sidewall of the second selection line trench via optional conducting liner 270, i.e., to a vertical selection diode to be formed in subsequent processing processes.

The top view on the chip as illustrated in FIG. 5a illustrates that insulating material 520 is shaped to stripes, which hide the second selection lines, i.e., the second selection line stacks. The top and sidewalls of a second selection line stack are covered by insulating material, which in this embodiment may be a nitride cap formed of 520, 530. FIG. 5b illustrates the stack structure of the second selection line. In this embodiment the second selection line includes the polysilicon layers 280, 500 and the metal-containing line 510, which enhances the conductivity of a second selection line. Conducting coating 270 serves as electrical interface for coupling a second selection line to substrate 200 at one sidewall of a wordline trench, wherein the substrate 200 is shaped to pillars by the second selection lines and the perpendicular running STI 210. These pillars may have a substantially square bottom area or, as the pillars tend to rounded edges with decreasing dimensions, may have a rounded bottom area.

After the second selection lines have been structured, wherein at least layer 230 has been removed from the top surface of the substrate pillars, implants can be performed to form first implanted diode regions of the selection diodes, i.e., p-type doped anodes in this embodiment, in the substrate pillars. The first implanted regions of the first conductivity type may be formed by deep implanting phosphorous (P) or arsenic (As) ions into the substrate pillars, which are arranged as illustrated by reference numeral 610. For the sake of completeness it is mentioned that this formation of the first implanted regions can also be performed earlier in the process, i.e., whenever a suitable dopant can be deep implanted into the substrate pillar. Regions 620 of a second conductivity type, i.e., regions of conductivity type opposite to that of the first implanted areas, are formed by implanting suitable ions, for example of boron (B) or boron fluoride (BF2) ions, in an area located above and adjoining the first regions 610, for example by implanting P ions into the substrate. In an alternative embodiment the conductivity types of the first and second diode regions may be switched, such that the first diode region is P and the second diode region is N doped thus inverting the direction of conductivity in the diode.

A first region 610 is located adjoining the second selection line material 280 in order to allow a current to enter the first diode region 610 from the second selection line. Therefore the dopant is implanted for example by a high energy implanting process, which allows a deep implant of the dopant ions into the substrate pillars at a depth such that first diode regions 610 couple to second selection line material 280. However the depth of the implant is limited such that the depth of the doped area does not reach the depth of the insulator 260 located in the lower portion of the second selection line trench. Insulator 260 thus separates first diode regions 610 of adjacent rows of diodes.

The formation of the first and second diode regions has completed the diodes, i.e., the selection devices for selecting one memory cell from an array of cells.

In the following described processes the memory elements and first selection lines for controlling the memory cells are created and coupled to the diodes. As the production of memory elements and a first selection line are similar to known semiconductor structures, the following processes for producing the memory elements, i.e., the volumes of resistively switching material and coupling them to the diodes are described in brief.

In a subsequent processing step and as illustrated in FIGS. 7a to 7c one or more layers of insulating material, for example of silicon nitride and oxide, may be deposited as an interlevel dielectric 710 to fill up the gaps between the layer stack 520. Then holes are etched into the MOL layer and filled by a suitable conducting liners and material, for example a metal like tungsten following a TiN liner, to form bottom electrode contacts 700, which will connect the second diode area 620 of a diode to a memory element. In the top portion of the bottom electrode contacts a suitable bottom electrode material 720 may be produced to couple to the actively switching volume of material. Subsequently the memory element is produced by forming volumes of switching active material 120, 121, which form the memory elements, for example by depositing a layer of switching active material and shaping this layer into dedicated volumes coupled to the bottom electrode contacts 720. The interspace between the volumes of switching active material 120, 121 is filled with a suitable dielectric 730, for example silicon dioxide. Then first selection lines 140, which couple to the upper end of the volumes of switching active material 120, 121 are produced. The first selection lines 210, 211 are arranged perpendicular to the second selection lines. The memory cells may then be accessed by selecting an associated pair of one first and one second selection line.

When selecting one of the plurality of memory cells by selecting a pair of a word and a first selection line, i.e., by applying a voltage to the first selection line 140 and applying a zero voltage to the selected second selection line, a corresponding current as indicated by arrows 740 in FIG. 7b will flow from first selection line 140 through the memory element, i.e., through the volume of resistively switching material 121, and through bottom electrode contact 720 into the diode including second diode area 620 and first diode area 610. The current will leave the diode via coating 270, i.e., the buried strap interface 270, and is dissipated by the second selection line, which in this embodiment is a stack of layers 280, 500 and 510 and which in FIG. 7b runs into the paper plane of the drawing. Non-selected diodes are kept in a non-conducting state.

Note that in the top view as illustrated in FIG. 7a some insulating elements, for example insulating elements on top of the second selection line, are omitted in order to illustrate the arrangement of the relevant elements. Similar as in FIG. 7b arrows 740 illustrate the direction of a current flowing when selecting a dedicated pair of one first selection line 140 and one second selection line, which in this embodiment is exemplified by its metal layer 510. According to the conductive direction of the diode the current flows from first selection line 140 vertically into the memory element arranged below first selection line 140 and further vertically down through the bottom electrode contact 720, through the diode and finally into the second selection line, which dissipates the current.

As illustrated the architecture presents a diode coupled to a second selection line, wherein the lower portion of a second selection line is coupled at one sidewall to a first diode region of the diode, wherein the first diode region is arranged below a second diode region.

Figure 8C:
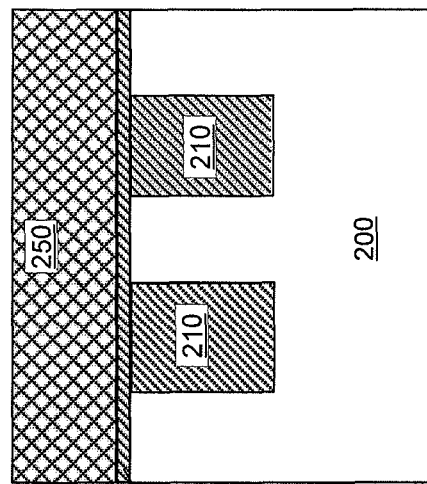
FIGS. 8a-c to 9a-c illustrate schematics of top-down view cross sectional views of another embodiment.
Figure 8B:
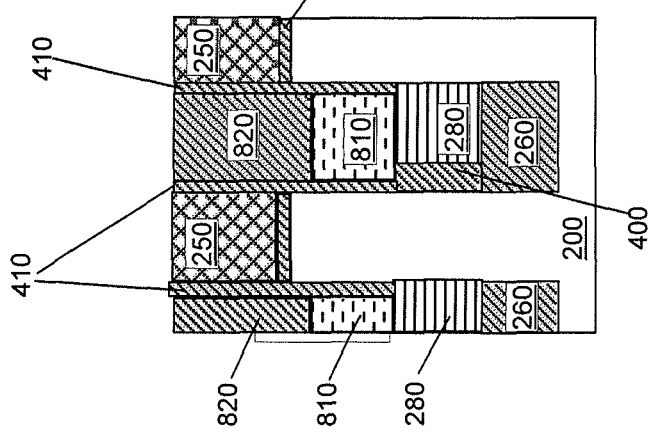
Figure 8A:
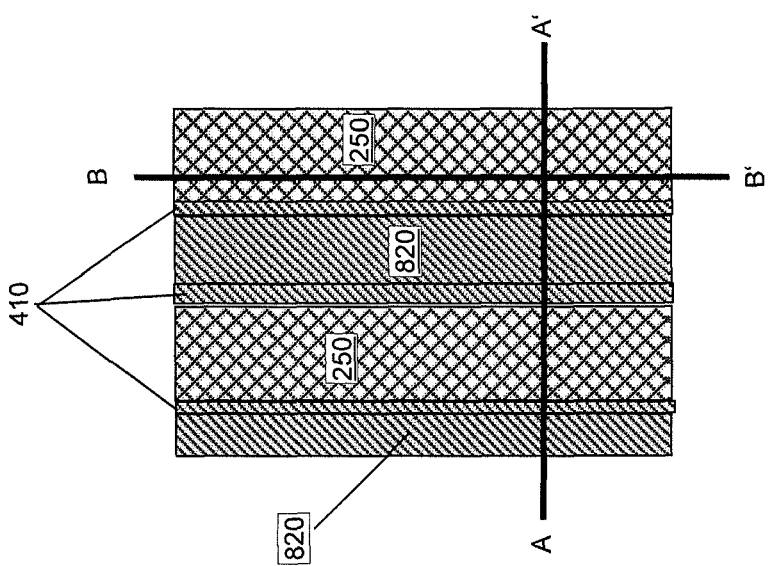

In some embodiments, i.e., as illustrated in FIGS. 8 to 9, a second selection line may be formed as a stack of conducting poly silicon and a metal, for example tungsten, wherein the second selection line is incorporated completely in the second selection line trench. Starting from a clean substrate surface the early processing steps of forming a shallow trench insulation 210, etching the second selection line trenches and forming a first conducting layer 280 in the second selection line trenches are similar to those as illustrated in above FIGS. 2 to 4, except that exemplary a different hardmask stack is used, such that FIGS. 8a-8c illustrate the features diverging from the previous described structures.

Diverging from the second selection line stack as described in the earlier embodiment a second selection line trench is filled with a metal 810, for example such as tungsten, after the first second selection line material 280 has been deposited on trench oxide 260, wherein second selection line material 280 is coupled to one sidewall via strap interface 270 and is insulated from substrate 200 at the opposite sidewall of the trench by dielectric 400, and after an insulator 410 covers the sidewalls remaining above dielectric 400 and strap interface 270.

Metal 810 is subsequently recessed by a recess etch to a level below the top ridge of the second selection line trench. Subsequently the trench is filled up with an insulator 820, for example such as silicon dioxide, thus insulating the top of the second selection line and closing the second selection line trench. All layers of the second selection line including the conducting poly silicon line 280, the conducting coating 270 and the metal line 810 are thus buried below the surface of the original substrate 200.

Figure 9C:
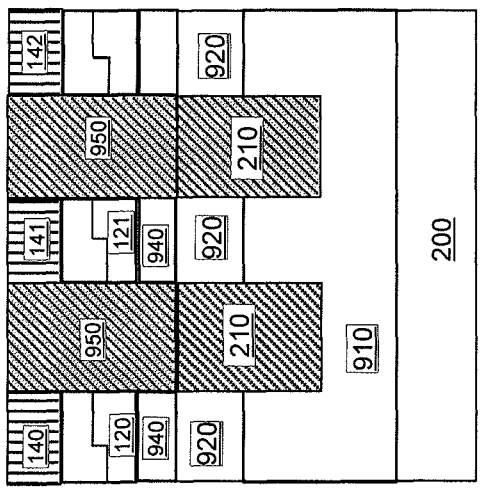
Figure 9B:
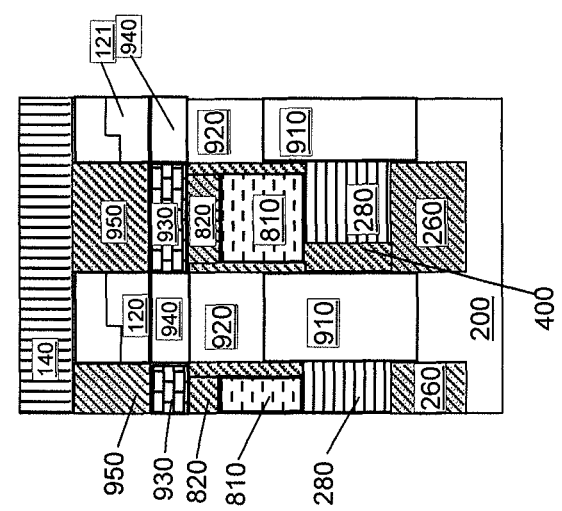
Figure 9A:
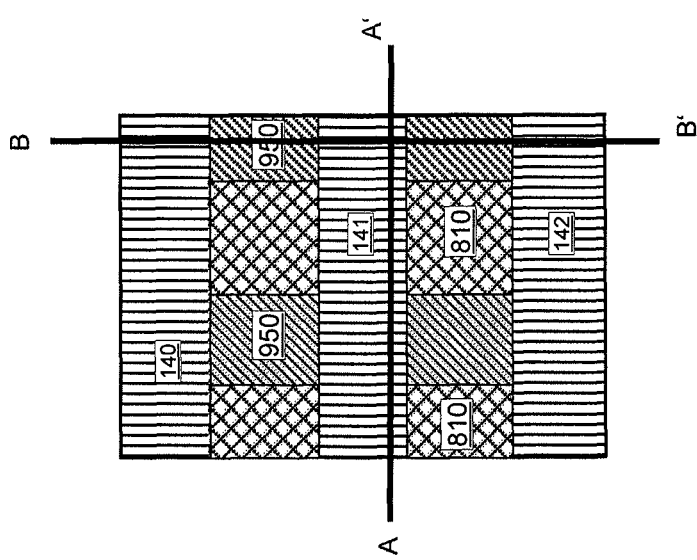

The further processes, in which the diodes are formed and the memory elements are produced and connected to the diodes, are similar to that described above. FIGS. 9a-9c illustrate the structure after having performed these processes. In order to bare the substrate 200 the thick pad nitride layer 250 and underlying layer 220 are removed from the chip, which may be achieved by a conventional chemical mechanical polishing process that also recesses insulator 820 substantially to the level of the original substrate 200. Subsequently device implants are performed in order to form the first and second diode areas 910, 920, i.e., to form the selection diodes as illustrated in FIGS. 9. Then a middle-of-line layer (MOL) 930 is deposited on the chip. Contact holes are etched into the MOL 930 and filled with a suitable conducting material, for example a metal like tungsten, to form bottom electrode contacts 940, which will couple the second diode area to a memory element. The memory elements 120, 121 are then formed by depositing a layer of resistively switching material on the chip, which is shaped into separate volumes connecting to the bottom electrode contacts 940. Interspaces between the memory elements are filled with a suitable dielectric 950, for example silicon dioxide. Lastly first selection lines 140 are formed on top of the memory elements by depositing a layer of suitable conducting material, for example a metal such as tungsten, and shaping the material to lines by conventional lithographic and etching processes.

FIGS. 9a-9c illustrate that the structure of this second embodiment differs in the second selection line structure only. The mode of operation of the memory cells is thus similar to that described above.

In some embodiments the second selection line can be formed such that it connects to a diode at one vertical sidewall, wherein the cross section of a second selection line is shaped to have a shoulder connecting to the diode.

Figures 10A, 10B, 10C:
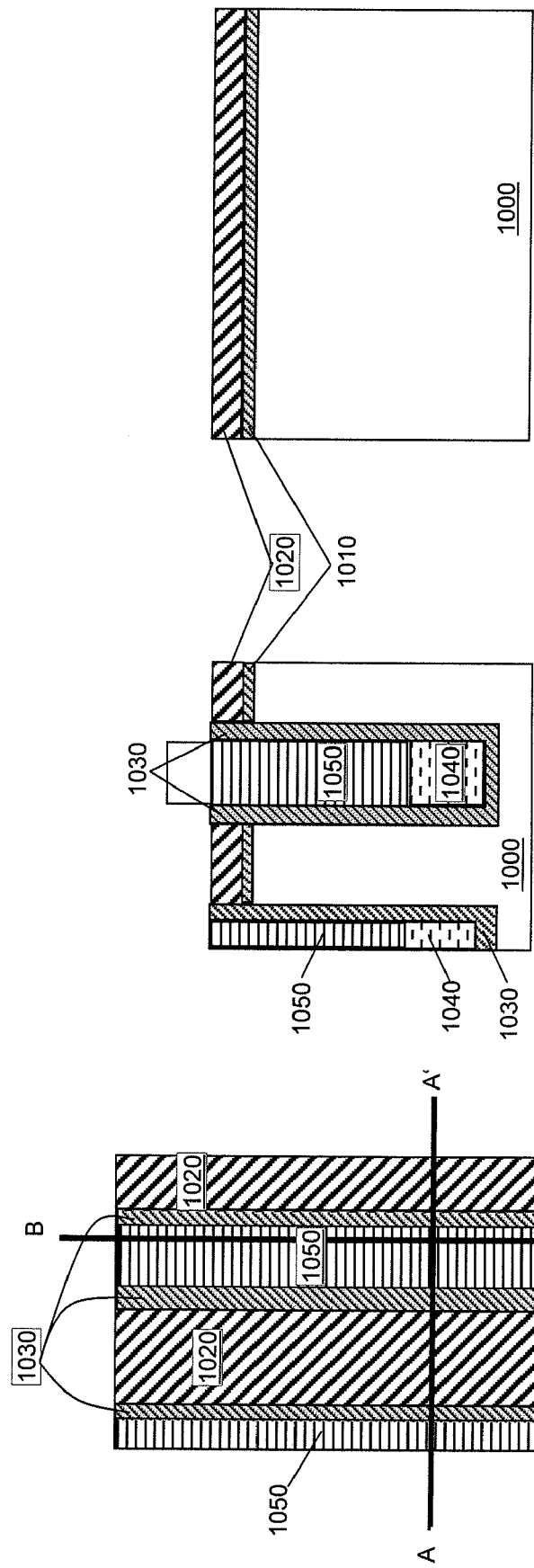

FIGS. 10a-10c illustrate the early processing steps starting from a slightly p-doped substrate 1000, wherein prior to etching a second selection line trench a layer of insulating material 1010, for example of silicon dioxide, and a comparatively thick pad layer 1020, for example of silicon nitride, are deposited on the substrate. By using a conventional etching process second selection line trenches are etched into layers 1010, 1020 and into substrate 1000. The second selection line trenches, i.e., the sidewalls and the bottom, are then oxidized to be covered by a thin layer of suitable insulating material, for example such as silicon dioxide. In one example a thin insulating liner 1030 is applied to the sidewalls and the bottom of a second selection line trench. Alternatively substrate 1000 may be oxidized by a conventional method, for example by thermal oxidizing, to produce insulating liner 1030.

The second selection lines are then filled with conducting material 1040, for example such as highly doped poly silicon or carbon or a metal-containing conductor like titanium nitride, which is recessed by a recess etch selectively to liner 1030 and pad 1020 and to a level well below the top ridge of the second selection line trench. Then the remainders of the second selection line trenches are filled with a second conducting material 1050, which in this embodiment may be conducting poly silicon.

FIGS. 11a-11c illustrate the structure after the second conducting material 1050 and the insulating liner 1030 have been recessed by a recess etch to the same level, wherein the insulating liner 1030 and the second conducting material layer 1050 may be etched at the same time by one etching process. In an alternative etching process the second conducting material may be etched prior to etching the liner material 1030, wherein different etching methods or etching times may be used according to the specific properties of the materials.

The second selection line trenches are then filled with a conducting material 1110 forming a third conducting layer in the second selection line trench, which may be for example of conducting poly silicon. This layer subsequently is recessed by a recess etch, wherein for example the recess etch may be an anisotropic etching process, which substantially removes material 1110 from horizontal surfaces while leaving vertical surfaces untouched. The third layer 1110 in this processing stage adjoins and thus couples to the substrate 1000 at both sidewalls of a second selection line trench in the shape of a strap along the second selection line trench. As will become clear from subsequent processing stages the height of material 1110, i.e., the thickness of layer 1110, determines the contact area size of a second selection line to a selection diode. Accordingly the size of the contact area can be determined by choosing an appropriate layer thickness of 1110.

Then layer 1110 is etched to disconnect from one sidewall, such that it couples to the substrate at only one sidewall of the second selection line trench, i.e., as illustrated in FIGS. 12a-12c. That is a portion of 1110 is removed and the remaining material 1110 couples layer 1040 to the substrate at one sidewall of the second selection line trench. A second selection line is thus coupled at one of its sidewalls to the substrate 1000. The etching process for removing the portion of layer 1110 for example can be performed by a process similar to that described with reference to FIG. 3.

In this way the second selection line includes a third conducting layer on top of a second conducting layer on top of a first conducting layer, wherein the third conducting layer only couples to the substrate at one vertical sidewall, where the vertical diode is formed in later processes.

Subsequently the second selection line trench is filled up with a suitable dielectric 1210 as illustrated in FIGS. 12a-12c, for example silicon dioxide.

Furthermore a shallow trench insulation (STI) 1220 is formed by etching trenches and filling these with a suitable dielectric, for example silicon dioxide, wherein the etching process may be any conventional process. The shallow trench insulation trenches are perpendicular to the direction of the second selection lines and pass through the second selection line trenches, wherein the depth of the STI trenches is chosen shallower than the depth of a second selection line trench, such that they do not interfere with the function of the second selection line. Accordingly in one embodiment the shallow trench insulation may extend into layer 1110 and in layer 1050, but may not extend into the higher conducting material 1040. Alternatively and as illustrated in the figures the depth of the shallow trench insulation may be chosen such that it does not interfere with any conducting layer of the second selection line, i.e., the STI may extend into insulator 1210 only. The combination of the shallow trench insulation and the perpendicular second selection lines affect pillars of substrate 1000, wherein a pillar is delimited by a pair of adjacent second selection lines and a pair of adjacent shallow trench insulation trenches.

Filling of the STI trenches can be performed in the same processing step when filling up the second selection line trenches with insulator 1210. Furthermore the formation of the shallow trench insulation may be performed preferentially together with support devices, which are peripheral to the array of memory cells and which support the operation of the cells.

FIGS. 13a to 13c illustrate that in a next processes thick nitride pad 1020 and insulating layer 1010 are removed from the chip surface for example by a wet chemical etch, such that the tops of the substrate pillars are bared.

Then first diode regions 1310 of a first conductivity type, for example of N type conductivity, are formed by deep implanting ions into the lower portions of the substrate pillars, wherein the depth of implant, i.e., the implantation energy, is chosen, such that a region couples to layer 1110. That is the implanted region vertically overlaps with layer 1110. In some embodiments, the implanted region vertically does not extend the depth of a second selection line trench, such that a second selection line trench insulates adjacent first diode regions. Furthermore the first diode regions vertically extend to a level above the bottom of the shallow trench insulation 1220.

Second diode regions 1320 of a second conductivity type, for example of P conductivity, are then formed by implanting ions of the second conductivity type. These regions 1320 are located in the substrate pillars and vertically above the first diode regions 1310. The implantation energy is chosen such that the second diode regions 1320 vertically extend from the bared surface of the substrate pillars to the first diode regions 1310, such that the first and second diode regions form vertical diodes in the pillars, wherein at least the second diode regions are separated by an intermediate STI trench 1220 from each other. For the sake of completeness it is noted that formation of the diode regions can be performed also at earlier processing stages, i.e., whenever substrate pillars are accessible for implanting suitable dopants to form first and second diode regions.

The direction of conductivity of the diodes may be switched by switching the conductivity type of the implantations, i.e., the first conductivity type is of P type and the second conductivity is of N type.

Subsequently the memory elements are formed and coupled to the diodes, wherein the necessary processing steps are similar to those described above, such that a description is kept brief here. So in a following processing step a middle-of-line layer MOL 1330 and an interlevel dielectric 1340 are deposited on the structure. Then holes located above the second diode regions are etched through these layers 1330 and 1340, which are subsequently filled with suitable conducting material to form bottom electrode contacts 1350. Then resistively switching material 1360 is deposited on the chip and shaped to separate volumes thus forming memory elements, each of which coupled to a selection diode, which in turn is coupled to a second selection line. The interspace between the volumes of resistively switching material is then filled with a suitable interlevel dielectric, before first selection lines 140, 141, 142 are shaped from a layer of conducting material, wherein the first selection lines are directed perpendicular to the second selection lines.

Figure 14:
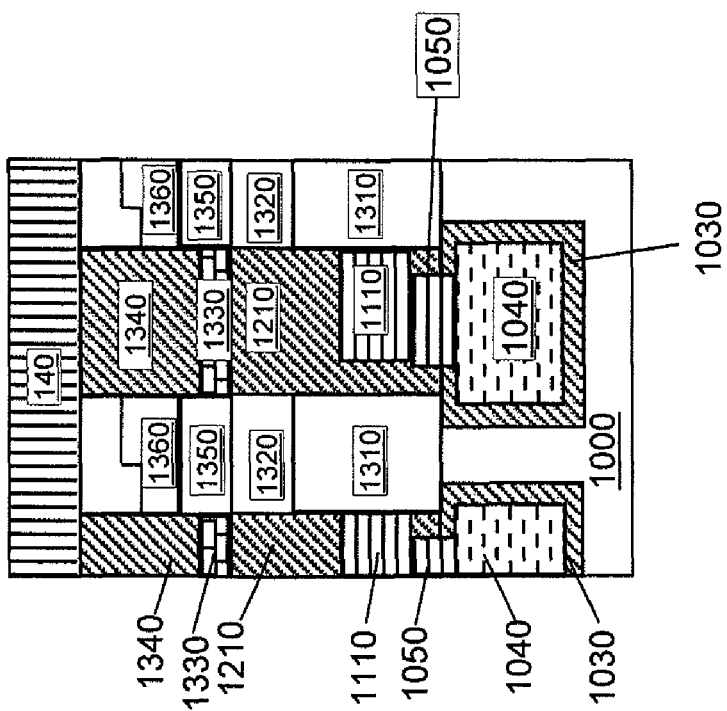
FIG. 14 illustrates a cross sectional view of another embodiment.

In some embodiments, such as the embodiment illustrated as a cross-sectional view along and through a bit line in FIG. 14, the cross-sectional area of a second selection line trench is shaped such that the lower portion of a second selection line, i.e., material 1040, is wider than an upper portion of the line, i.e., materials 1050 and 1110. Accordingly in a cross sectional view of the second word line the trench and the second word line take the shape of a bottle, i.e., with a wide body and a narrow neck, wherein the narrow neck couples to the diode at one vertical sidewall of the neck. A selection line having a cross sectional shape like this provides a greater cross-sectional area when compared to embodiments described above. Due to its increased cross-sectional area the conductivity of the second selection line is increased. Such a shaping can be achieved for example in an early processing stage right after second selection line trenches have been etched into the substrate. In a first etching process the trenches are etched such that they may have planar sidewalls, the width of a trench being constant throughout its depth. Subsequently a thin layer of etching resistant material is applied only to the upper portion of sidewalls for example by atomic layer deposition. Then an isotropic substrate etching process is applied, which due to the etching resistant layer removes substrate in the lower portion of the trench only, thus widening the trench in its lower portion. The etching resistance material may be removed afterwards. Then a layer of insulating material can be applied to at least the lower portion of the trench, before it is filled with a conducting material forming a second selection line. The etching resistant material may then be removed from the upper portion of the second selection line trench, such that subsequent processing steps as described above may be performed to couple the second selection line to one side of the second selection line trench while at the same time insulating the second selection line from the opposite sidewall of the upper portion of a second selection line trench.

Figure 15:
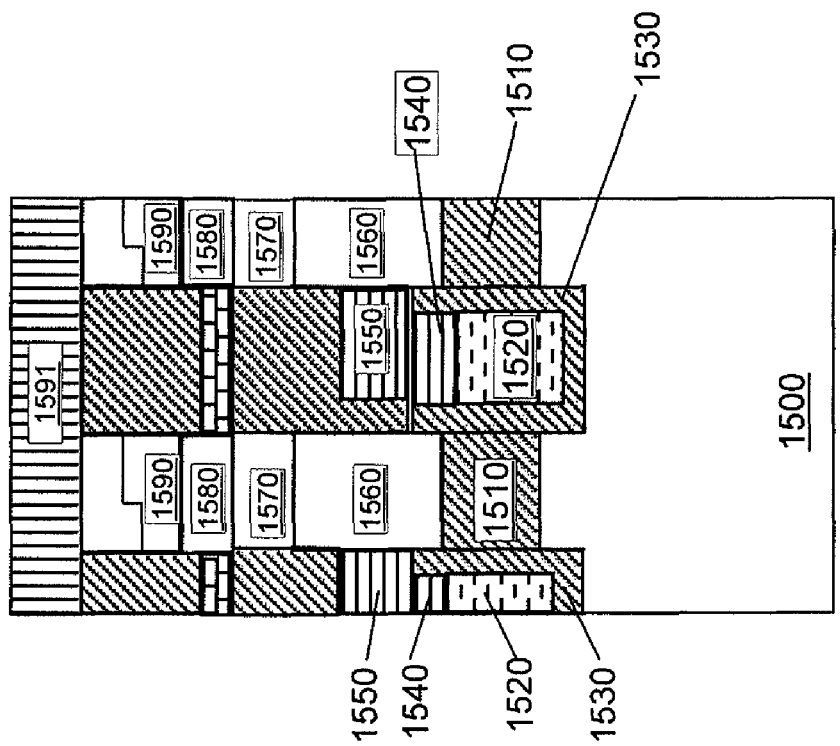
FIG. 15 illustrates a cross sectional view of another embodiment.

FIG. 15 illustrates an embodiment of the structure, wherein the structure elements are formed on silicon-on-insulator (SOI) substrate. That is the manufacturing process starts from a layered substrate. The layered substrate includes a layer of slightly p-doped silicon substrate on an insulating layer, which in turn is arranged on a substrate layer. Substrate wafers including this three-layered structure can be produced by forming the insulating layer on a substrate, wherein the insulator for example may be silicon dioxide, and by epitaxially growing a layer of silicon on the insulating layer.

The figure illustrates a cross sectional view through the structure, wherein the cut line is parallel to and through a bit line, i.e., a second selection line. In the illustrated variation first selection line 1520, i.e., the word line, vertically extends through insulating layer 1510 such that there is an insulating liner 1530, for example of silicon dioxide, for insulating the line from substrate 1500 in the respective trench. However the thickness of insulating layer 1510 may be chosen such that the trench vertically does not exceed through insulating layer 1510 such that there is no need for an insulating liner within the trench.

The sequence of manufacturing processes may differ in the early processing steps from the above-described processing sequences. In case the first selection line trenches do not extend into the substrate below insulating layer 1510 there is no need to produce an insulating liner within the trenches to insulate these from each other. Otherwise, i.e., if the trenches extend into the substrate below layer 1510, i.e., as indicated in FIG. 15, an insulating liner 1530 is formed to insulate the line. Subsequently the sequence of processing may then be similar to that described above to form word lines including a metal layer 1520 and conducting poly silicon layers 1540 and 1550 coupling to a vertical diode including first diode region 1560 and second diode region 1570 having conducting properties as described above. Formation of bottom electrode contacts 1580, switching elements 1590 and bit line 1591 as well as insulating layers can be formed as described above.

In some embodiments, a structure including a buried metal selection line, i.e., a word line, coupling at one sidewall to the selection diode is disclosed, wherein a diode region, i.e., in this embodiment the anode, is produced by out diffusion of dopant from a selection line material into substrate.

Figure 16C:
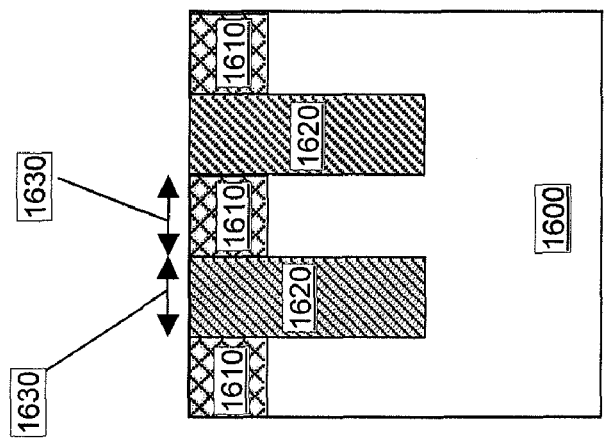
FIGS. 16a-c to 24a-c illustrate schematics of another embodiment.
Figure 16B:
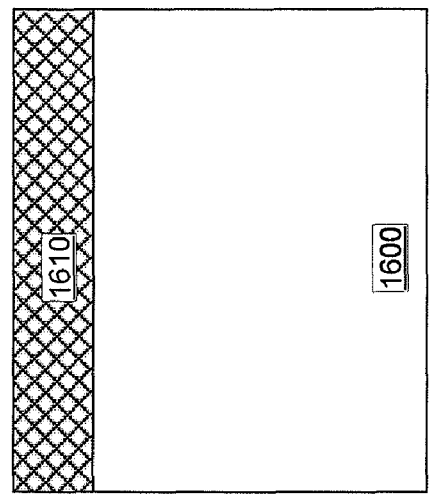
Figure 16A:
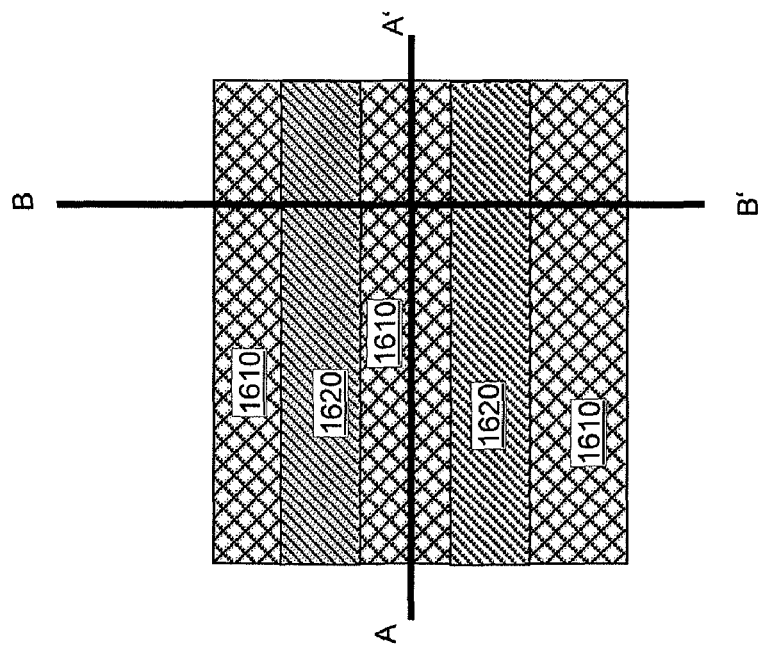

Referring now to FIGS. 16a to 16c, the manufacturing process in this embodiment starts from an p-doped substrate 1600. In the early processing steps a thick pad layer of silicon nitride 1610 is deposited on the substrate. Then a shallow trench insulation (STI) 1620 is formed, for example by a lithographic process followed by an etching process for etching trenches through the pad layer 1610 and into substrate 1600 and filling the trenches with a suitable insulating material 1620, for example silicon dioxide. Then the chip surface is planarized for example via a chemical-mechanical-planarizing (CMP) processing. FIG. 16a illustrates a top view on the chip illustrating alternating stripes of shallow trench insulation 1620 and thick pad nitride 1610. FIG. 16b illustrates a cross sectional view along cut line A-A' running parallel and through a stripe of thick pad nitride 1610. FIG. 16c illustrates a cross-section along cut line B-B' running perpendicular to the stripes of STI 1620. As illustrated by arrows 1630, 1631 the width of the STI and the distance between these is 1 F each, i.e., the smallest possible feature size.

The effects of the next processing steps are illustrated in FIGS. 17a to 17c. Subsequent to the planarizing process a first process of etching the first selection line trenches is performed by using conventional lithographic and etching processes. As indicated by arrows 1710 and 1711 the arrows are of minimum width, i.e., 1 F, and of minimum distance, i.e., also 1 F. These trenches are directed perpendicular to the direction of STI 1620.

In a first etching process the trenches are etched to a depth denoted by arrow 1720, i.e., this first etching does not extend the trench to its final depth. A thin liner of silicon nitride 1730 is then deposited on the chip and an anisotropic spacer etch is performed, such that the silicon nitride liner is removed from horizontal surfaces, but maintained at vertical surfaces. Insulating nitride liner 1730 thus covers the sidewalls of the trench only.

In a second etching process the substrate is etched selectively to silicon nitride, i.e., the nitride liner 1730 and the nitride pad layer 1610, in order to deepen the trench to a depth below that of the first etching process but not extending the depth of the shallow trench insulation. Due to the second etching to a depth below that of insulating liner 1730 the sidewalls of the trenches are not fully covered by liner 1730.

Figure 18C:
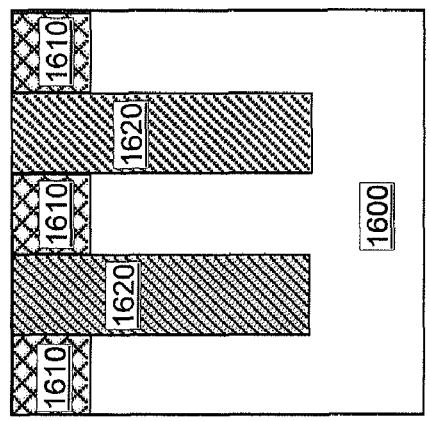
Figure 18B:
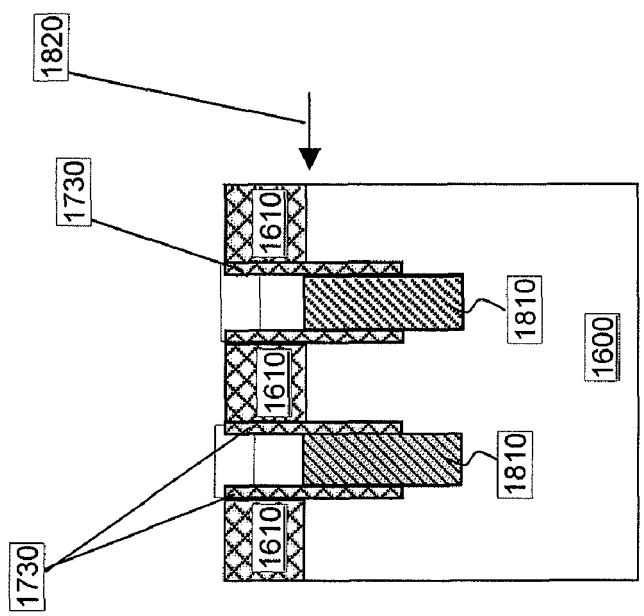
Figure 18A:
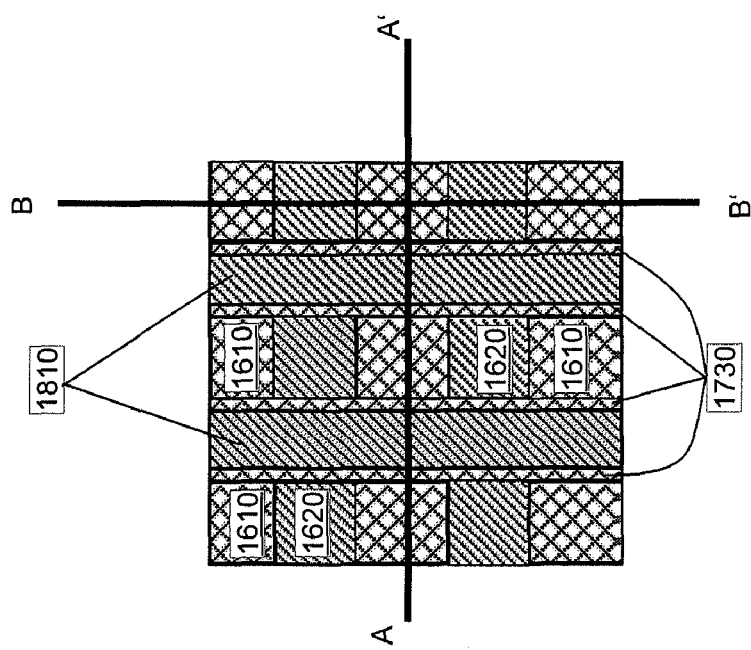

FIGS. 18a to 18c illustrate the structure after having filled the first selection line/word line trenches with a suitable insulating material 1810, for example silicon dioxide. Insulator 1810 is then recessed, for example by a conventional dry or wet etching process, to a level below surface level of the chip, preferable to a level substantially that of the original substrate as indicated by arrow 1820.

A thin liner 1910 of amorphous silicon is then deposited on the chip surface. Then an angled/tilted implant is performed as indicated by arrow 1920, such that the liner is doped at one vertical sidewall in a trench. Optionally a small portion of the liner located in a trench on insulator 1810 may be doped, which can be controlled by adjusting the implantation angle. The undoped silicon is then etched selectively to the doped silicon such that the doped portion of the liner is maintained on the chip, i.e., only the undoped portion of liner 1910 is removed. Due to the removal of liner 1910 the top surface of insulator 1810 is thus bared to the extent the liner was removed.

Figure 19C:
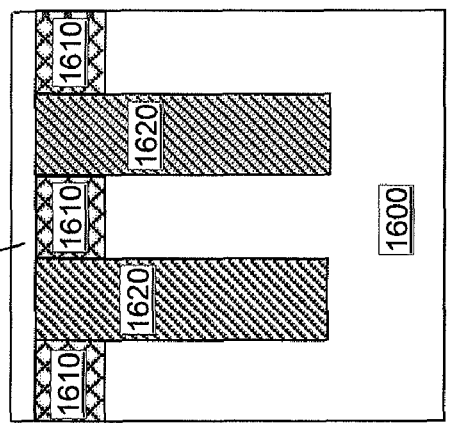
Figure 19B:
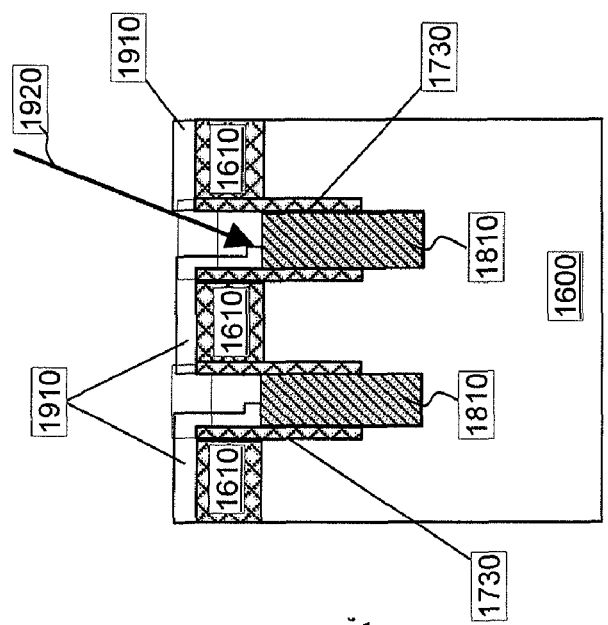
Figure 19A:
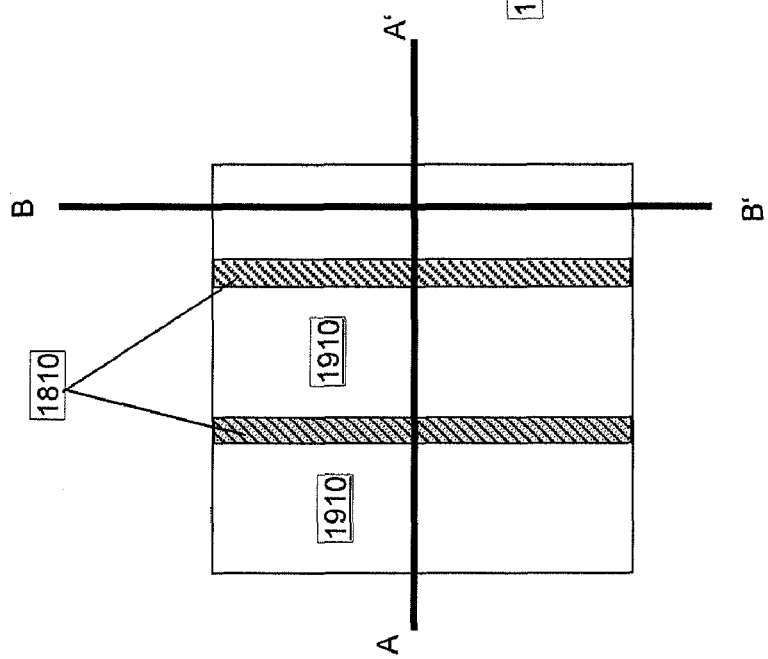

FIG. 19a illustrates the top surface of the structure being covered by liner 1910 and only a portion of insulator 1810 bared. Similarly FIGS. 19b and 19c illustrate that liner 1910 covers the top surface of the chip, wherein a portion of insulator 1810 is bared, i.e., where liner 1910 is removed.

Figure 20C:
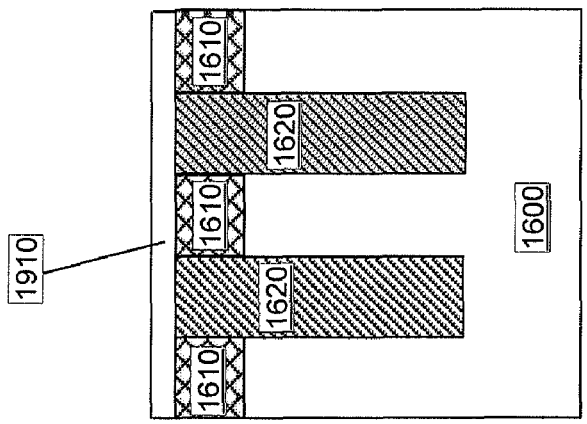
Figure 20B:
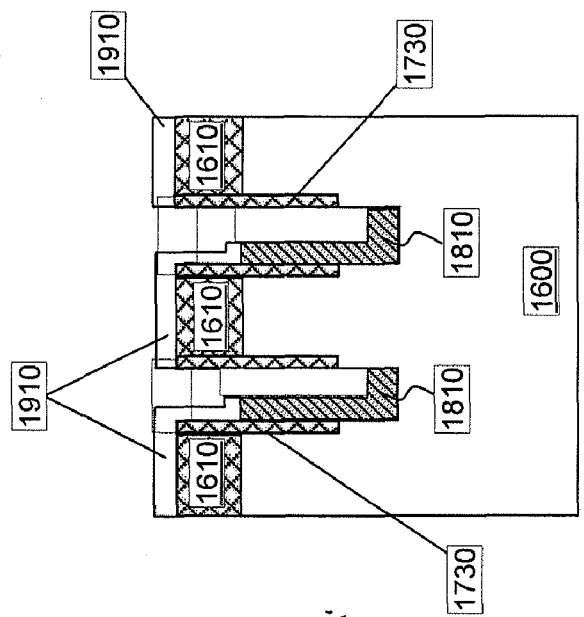
Figure 20A:
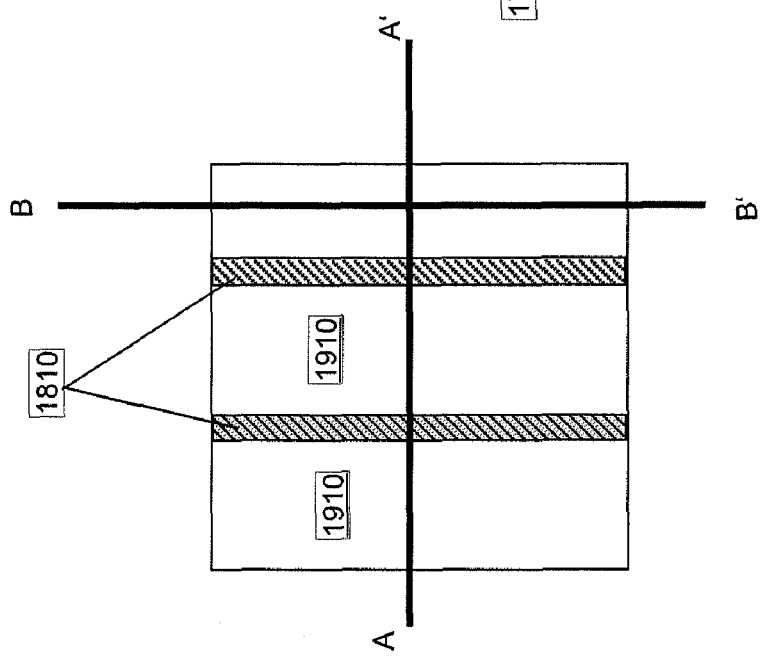

Subsequently an anisotropic etching process, for example a dry etching process, is performed to remove insulator 1810 below the remainder of liner 1910 as illustrated in FIGS. 20a to 20c. This etching process is thus highly selective to liner 1910, silicon nitride 1730 and substrate 1600, such that only insulator 1810 is removed. This etching process is stopped in order to maintain a liner of insulator 1810 at the bottom and on one vertical sidewall of the trench only, i.e., insulator 1810 is removed from one vertical sidewall of the selection line trench thus baring the substrate 1600 below silicon nitride liner 1730.

Figure 21C:
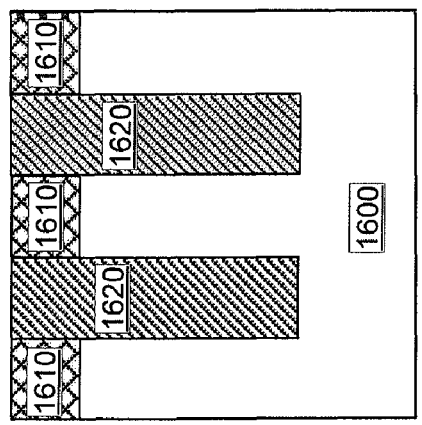
Figure 21B:
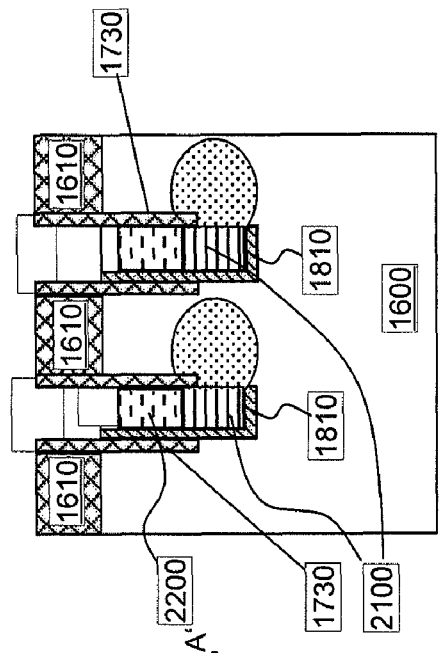
Figure 21A:
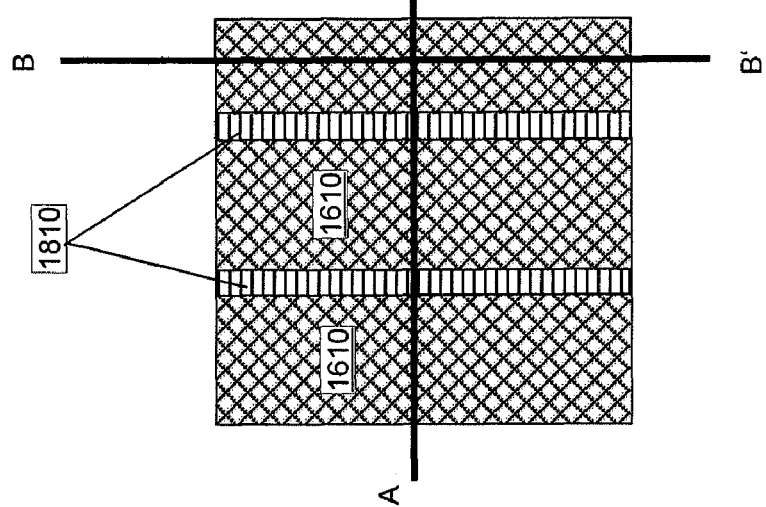

The remaining insulator 1810 is further etched to form a thin insulating liner 1810 in the selection line trench as illustrated in FIGS. 21a to 21c. In particular a dry etching providing an isotropic and highly controllable etching with a constant etching rate regardless of the density of the material may be considered here, such that material 1810 is etched at the sidewalls with the same rate as on the ground of the trench.

Subsequently after etching insulator 1810 the selection line trenches are filled with highly doped polycrystalline silicon 2100, wherein the doping is of n-type. Doped silicon 2100 is then recessed by a conventional recess etch to a level such that n-doped silicon 2100 couples to substrate 1600 at one vertical sidewall of the trench, wherein the recess stops above the lower edge of insulating liner 1730. As the layer of highly doped silicon 2100 forms part of the selection line the contact area of the selection line to the selection diode, i.e., cathode 2110, in this way is defined by the depth of insulating liner 1730.

By conventional processing, i.e., a thermal treatment, the dopant of n-type diffuses from silicon 2100 into substrate 1600 thus forming an area of n-doped substrate material 2110, i.e., a cathode. In this way a vertical diode is formed, which includes a first diode region of p-doped substrate as anode located above a second n-doped diode area, i.e., substrate area 2110 as cathode, wherein the cathode of the diode couples to a first selection line at one vertical sidewall of the selection line. The extension of the cathode accordingly to a large extend is thus defined by the depth of insulating liner 1730.

The extension of n-doped area 2110 can be controlled by controlling the doping degree in silicon 2100, by controlling the thermal treatment of the chip. Also the vertical extension depends on the vertical extension of the contact area between silicon 2100 and substrate 1600. The p-n junction within the diode is thus self-aligned and its vertical depth from the top surface of substrate 1600 can be controlled by controlling the depth of liner 1730 and the depth of the trench.

After the pn-junction of the diode is formed a silicide is produced on top of 2100 to couple to a metal layer 2200 deposited on the chip. Metal 2200 subsequently is recessed to a level well below the top edge of the trench. Metal layer 2200 thus couples to highly doped silicon 2100 and improves the conductance of the selection line. The selection line, which includes a first layer 2100 and a second layer 2200, is thus completely arranged below the top edge of the selection line trench and hence buried below the substrate surface of the original substrate 1600.

Note that the aspect ratio of the remaining selection line trench in this embodiment can be configured by controlling the depth of the remaining trench by controlling the extent of the etchback of silicon 2100. In this way a suitable aspect ratio for accurately depositing the metal on silicon 2100 can be achieved.

Then a suitable insulator 2210, for example silicon dioxide, is deposited on the chip to fill up the trench, which is then planarized using thick pad nitride 1610 as stop.

Figure 22C:
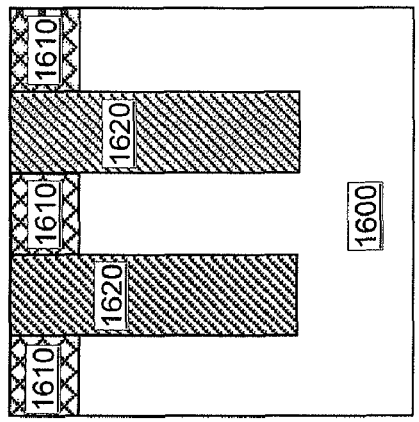
Figure 22B:
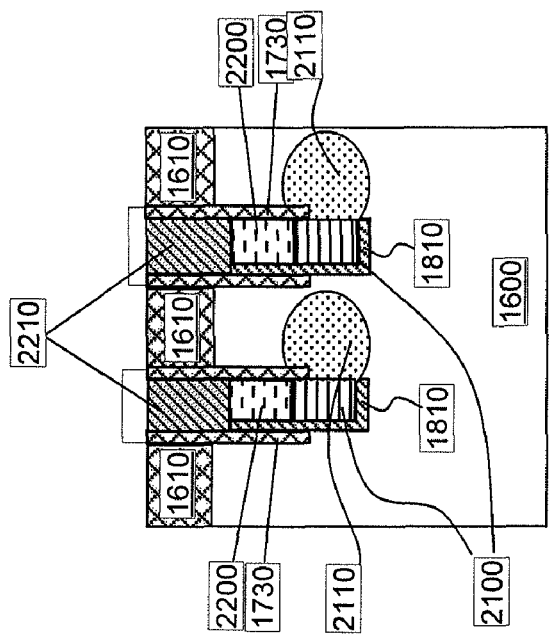
Figure 22A:
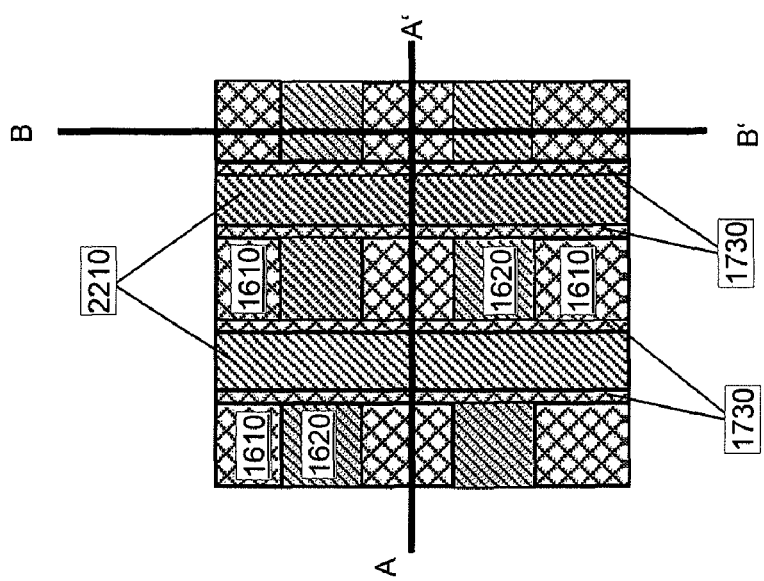

FIGS. 22a to 22c illustrate the structure after the diode is formed and the trench is filled with selection line layers 2100 and 2200 and closed by insulator 2210.

Subsequent to forming the selection diodes and the first selection lines in the trenches the memory elements are formed and coupled to the anodes of the selection diodes and furthermore coupled to second selection lines. As the related processing steps are similar to those mentioned above they are described briefly here.

Figure 23C:
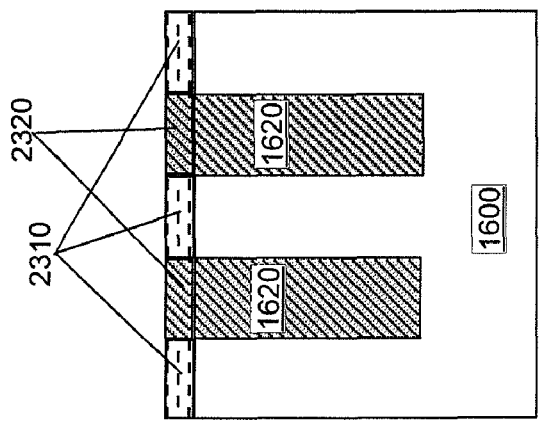
Figure 23B:
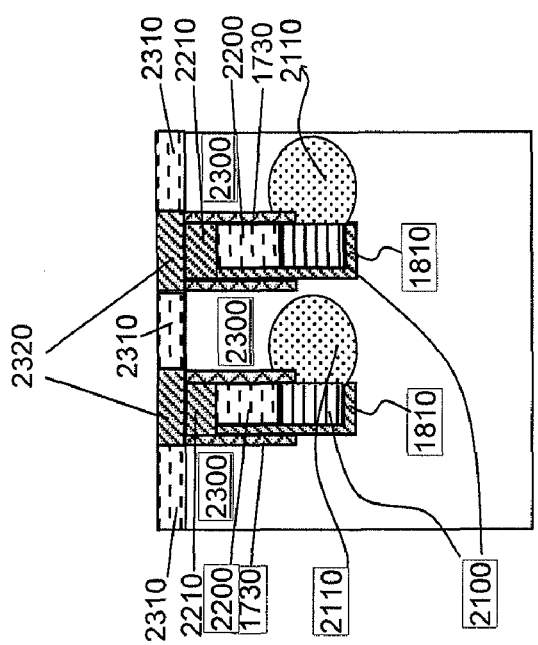
Figure 23A:
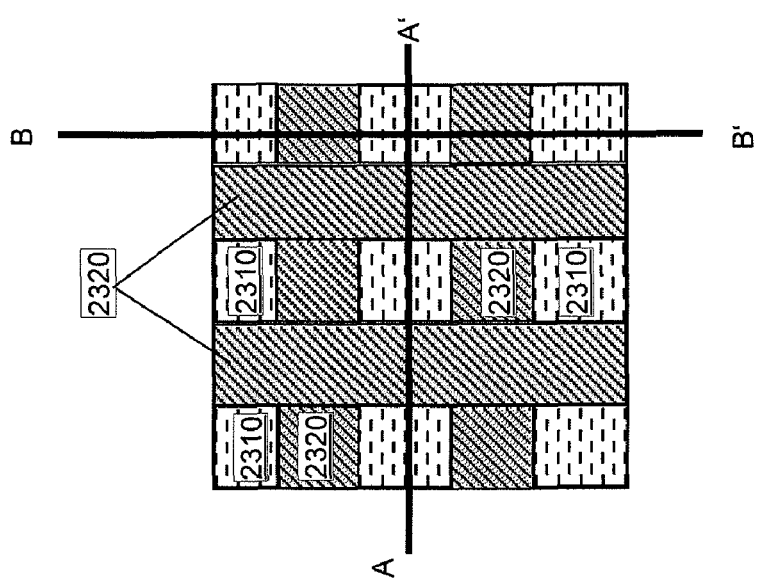
Figure 24C:
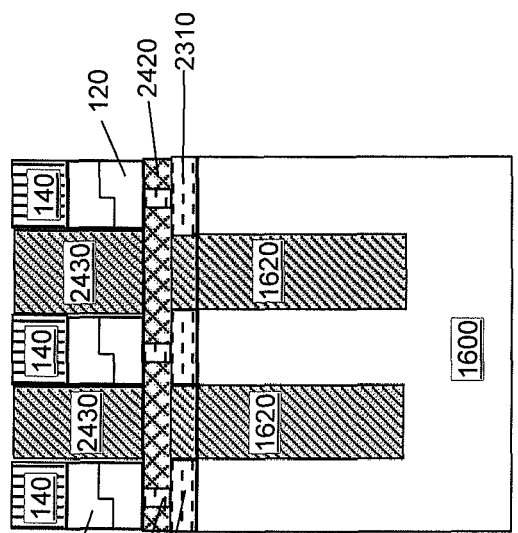
Figure 24B:
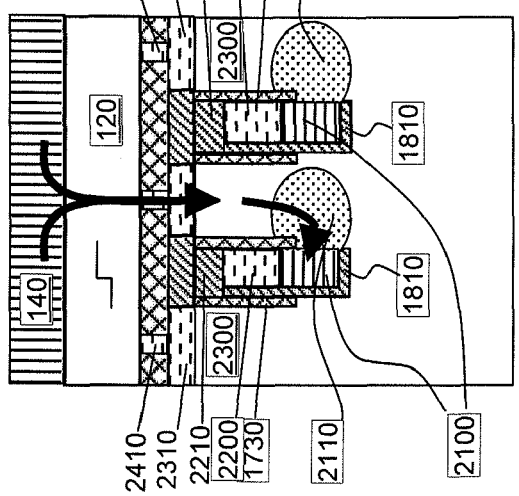
Figure 24A:
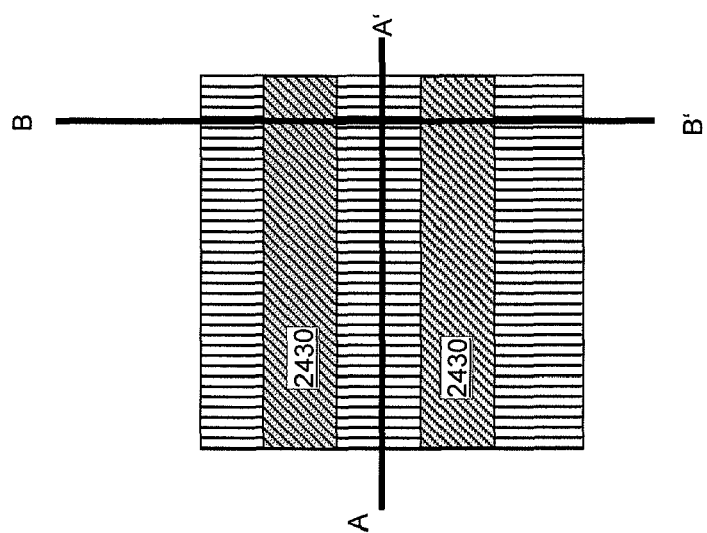

As illustrated in FIGS. 23a to 23c, for preparing the coupling of the diodes to memory elements the thick pad nitride 1610 is stripped from the chip surface. Subsequently implants can be performed optionally to adjust the doping in the anodes 2300 of the selection diodes. A silicide layer—not illustrated in the drawings—can be formed on the top surface of the bared anodes, i.e., a self-aligned silicide is produced on the top surface of the anodes to form a low-resistance transition metal allowing a low-resistance coupling to a metal contact formed on the anodes.

Metal contacts 2310 may be then formed on the anodes for example by depositing and structuring a suitable insulator 2320, for example a layer of silicon dioxide, which leaves contact holes on the anodes. These are filled with a metal thus forming contacts 2310 and the chip surface may be planarized to prepare further processing steps.

In subsequent processing steps a metallic connection of thin diameter, i.e., a heater 2410, is formed on each contact 2310. Lines of resistively switching material 120, i.e., for example GST material, are then formed as memory elements and coupled to the heaters. Second selection lines 140 are then produced on and coupled to the memory elements. Similar as mentioned for the embodiments described above the volumes/lines of resistively switching material are separated by suitable dielectric, for example such as silicon nitride 2420 or silicon dioxide 2430.

When operating the cell the voltage of selection line 2100/2200 is raised causing a current flow as indicated by arrows 2440. Current 2440 leaves second selection line 140 to flow through switching active material 120, through heaters 2320 and through metal contacts 2310 to the vertical diode including anode 2300 and n-doped cathode 2110. From cathode 2110 the current enters the highly n-doped silicon 2100, i.e., the selection line.

Another embodiment of the structure is illustrated in FIGS. 25a to 25c. Similar to the afore described embodiment, the first selection line includes a first layer 2100 and a second layer 2200 on top of first layer 2100, both layers of conducting material. In contrast to the sixth embodiment the combined height of both first selection line layers 2100 and 2200 does not exceed the height of the first diode region 2110. That is the combined height of the highly doped polycrystalline silicon layer 2100 and metal layer 2200 does not exceed the vertical extension of diode region 2110. An electrical field produced by the selection line when selecting accordingly will have a reduced gate effect on the diode as in a structure including a selection line of higher vertical extension allowing a current/voltage closer to the anode of the diode.

Considering the similarities to earlier embodiments this structure can be formed using similar processing steps. However the process for forming the structure differs in that after the thermal treatment for diffusing the dopant into the adjacent substrate the highly doped silicon layer 2100 is etched a second time to recess the top surface of the layer 2100 a second time. Then metal layer 2200 is deposited on the chip and subsequently recessed by a recess etch; wherein the recess etch recesses the metal to the desired height. That is for this structure the etching for recessing metal 2200 recesses the metal to a lower height than in the sixth embodiment. The processing then continuous as described for the sixth embodiment with depositing insulator 2210 to close the selection line trench.

The described structures may be integrated in an integrated circuit including an array of memory cells. Each cell in the structure includes a resistively switching memory element and a vertical selection diode coupled to a selection line in a selection line trench for selecting one from the plurality of memory cells of the array and wherein the selection line is coupled to the vertical selection diode at one vertical sidewall of the selection line trench.

Although specific embodiments have been illustrated and described herein, it will be appreciated by those of ordinary skill in the art that a variety of alternate and/or equivalent implementations may be substituted for the specific embodiments illustrated and described without departing from the scope. This application is intended to cover any adaptations or variations of the specific embodiments discussed herein. Therefore, it is intended that this invention be limited only by the claims and the equivalents thereof.

The invention claimed is:

1. An integrated circuit comprising an array of memory cells, each cell comprising:
    a resistively switching memory element;
    a vertical selection diode coupled to a selection line in a selection line trench for selecting one memory cell from the array of memory cells,
    wherein the selection line is coupled to the vertical selection diode at one vertical sidewall of the selection line trench;
    wherein the selection line comprises at least a first layer of conducting material and a second layer of conducting material, the second layer with respect to a substrate plane arranged on top of first material layer, and wherein the first layer of the selection line couples via a thin liner of conducting material to the vertical selection diode; and
    wherein the first layer of the selection line and the thin liner of conducting material have the same vertical extension.

2. The integrated circuit of claim 1, wherein the selection line in its cross sectional area comprises a horizontal protrusion, which is coupled at its vertical front surface to the vertical selection diode.

3. The integrated circuit of claim 1, wherein the diode comprises a first diode region of a first conductivity type and a second diode region of a second conductivity type, and wherein with respect to a substrate plane the first diode region is arranged vertically below the second diode region and the selection line couples to the first diode region.

4. The integrated circuit of claim 3, wherein the vertical extension of the first diode region equals or exceeds the vertical extension of the selection line.

5. The integrated circuit of claim 1, wherein the selection line comprises a third conducting layer on top of the second conducting layer.

6. The integrated circuit of claim 5, wherein the first and second conducting layers are of poly silicon and the third conducting layer is a metal.

7. The integrated circuit of claim 1, wherein the selection line comprises at least a first layer of conducting material and a second layer of conducting material, the second layer with respect to a substrate plane arranged on top of the first material layer, and wherein the first layer is coupled to the diode.

8. The integrated circuit of claim 7, wherein the second layer is arranged vertically below the top edge of the selection line trench.

9. The integrated circuit of claim 1, wherein the trench comprises a thick layer of insulating material arranged with respect to a substrate plane below the selection line.

10. An integrated circuit comprising:
    an array of memory cells, each cell comprising a resistively switching memory element;
    a vertical selection diode for selecting one from the array of memory cells; and
    a selection line in a selection line trench comprising a third conducting layer on top of a second conducting layer on top of a first conducting layer of conducting material,
    wherein the third layer only is coupled to the vertical diode at a vertical sidewall of the selection line trench.

11. The integrated circuit of claim 10, wherein the selection line in its cross section forms a horizontal protrusion, which couples at its vertical front surface to the vertical selection diode.

12. The integrated circuit of claim 10, wherein the diode comprises a first diode region of a first conductivity type and a second diode region of a second conductivity type, and wherein with respect to a substrate plane the first diode region is arranged vertically below the second diode region and the selection line is coupled to the first diode region.

13. The integrated circuit of claim 10, wherein the first and the second layer of the selection line are of the same material and the third layer of the selection line is of a different material.

14. The integrated circuit of claim 10, wherein the substrate adjacent to a selection line is separated by a trench insulation into pillars, and wherein the pillars are doped to form the vertical selection diodes.

* * * * *